(12) United States Patent
Park et al.

(10) Patent No.: US 11,651,799 B2
(45) Date of Patent: May 16, 2023

(54) METHOD OF GENERATING A MULTI-LEVEL SIGNAL USING A SELECTIVE LEVEL CHANGE, A METHOD OF TRANSMITTING DATA USING THE SAME, AND A TRANSMITTER AND MEMORY SYSTEM PERFORMING THE SAME

(71) Applicant: SAMSUNG ELECTRONICS CO., LTD., Suwon-si (KR)

(72) Inventors: Junyoung Park, Seoul (KR); Jaewoo Park, Yongin-si (KR); Younghoon Son, Yongin-si (KR); Youngdon Choi, Seoul (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/323,009

(22) Filed: May 18, 2021

(65) Prior Publication Data

US 2022/0059139 A1 Feb. 24, 2022

(30) Foreign Application Priority Data

Aug. 21, 2020 (KR) .......................... 10-2020-0105477

(51) Int. Cl.
*G11C 5/14* (2006.01)
*G11C 7/10* (2006.01)
(Continued)

(52) U.S. Cl.
CPC .............. *G11C 5/147* (2013.01); *G11C 7/109* (2013.01); *G11C 7/1063* (2013.01);
(Continued)

(58) Field of Classification Search
CPC ..... G11C 5/147; G11C 7/1063; G11C 7/1069; G11C 7/109; G11C 7/1096; G11C 11/565;
(Continued)

(56) References Cited

U.S. PATENT DOCUMENTS 7,124,221 B1\* 10/2006 Zerbe ................. H04L 25/0282
                                                    710/106
9,543,952 B2   1/2017 Lee
9,900,186 B2   2/2018 Shokrollahi et al.
10,348,536 B2  7/2019 Choi et al.
(Continued)

FOREIGN PATENT DOCUMENTS

KR   10-2009-0049290   5/2009

OTHER PUBLICATIONS

European Search Report dated Nov. 11, 2021 from the European Patent Office issued in corresponding European Patent Application No. 21174390.1.

*Primary Examiner* — Vanthu T Nguyen
(74) *Attorney, Agent, or Firm* — F. Chau & Associates, LLC

(57) ABSTRACT

A method of generating a multi-level signal having one of three or more voltage levels that are different from each other, the method including: performing a first voltage setting operation in which first and second voltage intervals are adjusted to be different from each other, wherein the first voltage interval represents a difference between a first pair of adjacent voltage levels and the second voltage interval represents a difference between a second pair of adjacent voltage levels; performing a second voltage setting operation in which a voltage swing width is adjusted, the voltage swing width representing a difference between a lowest and a highest voltage level among the three or more voltage levels; and generating an output data signal that is the
(Continued)

US 11,651,799 B2

Page 2 multi-level signal based on input data including two or more bits, a result of the first voltage setting operation and a result of the second voltage setting operation.

15 Claims, 25 Drawing Sheets

(51) Int. Cl.
*G11C 11/56* (2006.01)
*H04L 25/02* (2006.01)
*H04L 25/49* (2006.01)

(52) U.S. Cl.
CPC .......... *G11C 7/1069* (2013.01); *G11C 7/1096* (2013.01); *G11C 11/565* (2013.01); *H04L 25/028* (2013.01); *H04L 25/4917* (2013.01); *G11C 2207/101* (2013.01)

(58) Field of Classification Search
CPC ............ G11C 2207/101; H04L 25/028; H04L 25/4917
See application file for complete search history.

(56) References Cited

U.S. PATENT DOCUMENTS

| | | | |
|---|---|---|---|
| 10,403,337 B2 | 9/2019 | Butterfield | |
| 10,861,531 B2 * | 12/2020 | Hollis | .................. G11C 7/1057 |
| 10,938,392 B2 * | 3/2021 | Jeong | ................. H03K 19/0136 |
| 2007/0258293 A1 | 11/2007 | Lee | |
| 2009/0122904 A1 | 5/2009 | Jang et al. | |
| 2012/0113733 A1 | 5/2012 | Kim et al. | |
| 2014/0016404 A1 | 1/2014 | Kim et al. | |
| 2019/0044762 A1 | 2/2019 | Lin | |
| 2019/0296740 A1 | 9/2019 | Lin | |
| 2020/0007133 A1 | 1/2020 | Littmann et al. | |
| 2020/0013442 A1 | 1/2020 | Butterfield | |

* cited by examiner

METHOD OF GENERATING A MULTI-LEVEL SIGNAL USING A SELECTIVE LEVEL CHANGE, A METHOD OF TRANSMITTING DATA USING THE SAME, AND A TRANSMITTER AND MEMORY SYSTEM PERFORMING THE SAME

CROSS-REFERENCE TO RELATED APPLICATION

This application claims priority under 35 U.S.C. § 119 to Korean Patent Application No. 10-2020-0105477, filed on Aug. 21, 2020 in the Korean Intellectual Property Office (KIPO), the disclosure of which is incorporated by reference herein in its entirety.

1. Technical Field

Example embodiments of the inventive concept relate to semiconductor integrated circuits, and more particularly to methods of generating multi-level signals, methods of transmitting data using the methods of generating multi-level signals, and transmitters and memory systems that perform the methods of generating multi-level signals and the methods of transmitting data.

2. Description of the Related Art

In general, semiconductor memory devices are separated into two categories according to their ability to retain stored data in the absence of power. These categories include volatile memory devices, which lose stored data when power is lost, and nonvolatile memory devices, which retain stored data even when power is not supplied. Volatile memory devices may perform read and write operations at a high speed, although data stored therein may be lost at power-off. Since nonvolatile memory devices retain data stored therein in the absence of power, they may be used to store data that must be retained without regard to power supply considerations.

As the performance of the semiconductor memory device increases, a high communication speed (or interface speed) may be employed between memory controller and the semiconductor memory device. Accordingly a multi-level signaling technique in which a plurality of bits are transmitted during one unit interval (UI) has been researched.

SUMMARY

According to an example embodiment of the inventive concept, there is provided a method of generating a multi-level signal having one of three or more voltage levels that are different from each other, the method including: performing a first voltage setting operation in which a first voltage interval and a second voltage interval are adjusted to be different from each other, wherein the first voltage interval represents a difference between a first pair of adjacent voltage levels among the three or more voltage levels and the second voltage interval represents a difference between a second pair of adjacent voltage levels among the three or more voltage levels; performing a second voltage setting operation in which a voltage swing width is adjusted, the voltage swing width representing a difference between a lowest voltage level and a highest voltage level among the three or more voltage levels; and generating an output data signal that is the multi-level signal based on input data including two or more bits, a result of the first voltage setting operation and a result of the second voltage setting operation.

According to an example embodiment of the inventive concept, there is provided a method of generating a multi-level signal having one of three or more voltage levels that are different horn each other, the method including: performing a first voltage setting operation in which a first voltage interval and a second voltage interval are adjusted to be different from each other, wherein the first voltage interval represents a difference between a first pair adjacent voltage levels among the three or more voltage levels and the second voltage interval represents a difference between a second pair of adjacent voltage levels among the three or more voltage levels; performing a second voltage setting operation in which a third voltage interval and a fourth voltage interval are adjusted to be different from each other, wherein the third voltage interval represents a difference between a third pair of adjacent voltage levels among the three or more voltage levels and the fourth voltage interval represents a difference between a fourth pair of adjacent voltage levels among the three or more voltage levels, the third voltage interval being different from the first voltage interval or the fourth voltage interval being different from the second voltage interval; generating a first output data signal that is the level signal based on first input data including two or more bits and a result of the first voltage setting operation; and generating a second output data signal that is the multi-level signal based on second input data including two or more bits and a result of the second voltage setting operation.

According to an example embodiment of the inventive concept, there is provided a method of transmitting data based on a multi-level signal having one of a first voltage level, a second voltage level, a third voltage level and a fourth voltage level that are different from each other, the method including: performing a first voltage setting operation on a first channel such that at least two of a first voltage interval, a second voltage interval and a third voltage interval are different from each other, the first voltage interval representing a difference between the first and second voltage levels on the first channel, the second voltage interval representing a difference between the second and third voltage levels on the first channel, the third voltage interval representing a difference between the third and fourth voltage levels on the first channel; preforming a second voltage setting operation on the first channel such that a first voltage swing width, which represents a difference between the first and fourth voltage levels on the first channel, is changed; performing a third voltage setting operation on a second channel such that at least two of a fourth voltage interval, a fifth voltage interval and a sixth voltage interval are different from each other, the second channel being different from the first channel, the fourth voltage interval representing a difference between the first and second voltage levels on the second channel, the fifth voltage interval representing a difference between the second and third voltage levels on the second channel, the sixth voltage interval representing a difference between the third and fourth voltage levels on the second channel; performing a fourth voltage setting operation on the second channel such that a second voltage swing width, which represents a difference between the first and fourth voltage levels on the second channel, is changed; generating a first output data signal that is the multi-level signal based on first input data including a first bit and a second bit that are different from each other, a result of the first voltage setting operation and a result of the second voltage setting operation; generating a second output data signal that is the multi-level signal based on second input data including a third bit and a fourth bit that are different from each other, a result of the third voltage setting operation and a result of the fourth voltage setting operation; and transmitting the first and second output data signals through the first and second channels, respectively.

According to an example embodiment of the inventive concept, there is provided a transmitter configured to generate a multi-level signal having one of three or more voltage levels that are different from each other, the transmitter including: a voltage setting circuit configured to perform a first voltage setting operation such that a first voltage interval and a second voltage interval are different from each other, to perform a second voltage setting operation to adjust a voltage swing width, and to generate a plurality of voltage setting control signals representing a result of the first voltage setting operation and a result of the second voltage setting operation, the first voltage interval representing a difference between a first pair of adjacent voltage levels among the three or more voltage levels and the second voltage interval representing a difference between a second pair of adjacent voltage levels among the three or more voltage levels, the voltage swing width representing a difference between a lowest voltage level and a highest voltage level among the three or more voltage levels; a pull-up/pull-down control circuit configured to generate two or more pull-up control signals and two or more pull-down control signals based on input data including two or more bits and the plurality of voltage setting control signals; and a driver circuit configured to generate an output data signal that is the multi-level signal based on the two or more pull-up control signals and the two or more pull-down control signals.

According to an example embodiment of the inventive concept, there is provided a memory system configured to transmit data based on a multi-level signal having one of three or more voltage levels that are different from each other, including: a memory controller including: a first transmitter configured to generate a first output data signal that is the multi-level signal based on first input data; and a second transmitter configured to generate a second output data signal that is the multi-level signal based on second input data; a memory device including: a first receiver configured to receive the first output data signal; and a second receiver configured to receive the second output data signal; a first channel configured to connect the first transmitter with the first receiver, and to transmit the first output data signal; and a second channel configured to connect the second transmitter with the second receiver, and to transmit the second output data signal, wherein the first transmitter includes: a first voltage setting circuit configured to perform a first voltage setting operation such that a first voltage interval and a second voltage interval are different from each other, and to generate a plurality of first voltage setting control signals representing a result of the first voltage setting operation, the first voltage interval representing a difference between a first pair of adjacent voltage levels among the three or more voltage levels and the second voltage interval representing a difference between a second pair of adjacent voltage levels among the three or more voltage levels; a first pull-up/pull-down control circuit configured to generate two or more first pull-up control signals and two or more first pull-down control signals based on the first input data including two or more bits and the plurality of first voltage setting control signals; and a first driver circuit configured to generate the first output data signal based on the two or more first pull-up control signals and the two or more first pull-down control signals, and wherein the second transmitter includes: a second voltage setting circuit configured to perform a second voltage setting operation such that a third voltage interval and a fourth voltage interval are different from each other, and to generate plurality of second voltage setting control signals representing a result of the second voltage setting operation, the third voltage interval representing a difference between a third pair of adjacent voltage levels among the three or more voltage levels and the fourth voltage interval representing a difference between a fourth pair of adjacent voltage levels among the three or more voltage levels, the third voltage interval being different from the first voltage interval or the fourth voltage interval being different from the second voltage interval; a second pull-up/pull-down control circuit configured to generate two or more second pull-up control signals and two or more second pull-down control signals based on the second input data including two or more bits and the plurality of second voltage setting control signals; and a second driver circuit configured to generate the second output data signal based on the two or more second pull-up control signals and the two or more second pull-down control signals.

According to an example embodiment of the inventive concept, there is provided a memory system configured to transmit data based on a multi-level signal having one of three or more voltage levels that are different from each other, including: a memory device including: a first transmitter configured to generate a first output data signal that is the multi-level signal based on first input data; and a second transmitter configured to generate a second output data signal that is the multi-level signal based on second input data; a memory controller including: a first receiver configured to receive the first output data signal; and a second receiver configured to receive the second output data signal; a first channel configured to connect the first transmitter with the first receiver, and to transmit the first output data signal; and a second channel configured to connect the second transmitter with the second receiver, and to transmit the second output data signal, wherein the first transmitter includes: a first voltage setting circuit configured to perform a first voltage setting operation such that a first voltage interval and a second voltage interval are different from each other, and to generate a plurality of first voltage setting control signals representing a result of the first voltage setting operation, the first voltage interval representing a difference between a first pair of adjacent voltage levels among the three or more voltage levels and the second voltage internal representing a difference between a second pair of adjacent voltage levels among the three or more voltage levels; a first pull-up/pull-down control circuit configured to generate two or more first pull-up control signals and two or more first pull-down control signals based on the first input data including two or more bits and the plurality of first voltage setting control signals; and a first driver circuit configured to generate the first output data signal based on the two or more first pull-up control signals and the two or more first pull-down control signals, and wherein the second transmitter includes: a second voltage setting circuit configured to perform a second voltage setting operation such that a third voltage interval and a fourth voltage interval are different from each other, and to generate a plurality of second voltage setting control signals representing a result of the second voltage setting operation, the third voltage interval representing a difference between a third pair of adjacent voltage levels among the three or more voltage levels and the fourth voltage interval representing a difference between a fourth pair of adjacent voltage levels among the three or more voltage levels, the third voltage interval being different from the first voltage interval or the fourth voltage interval being different from the second voltage interval; a second pull-up/pull-down control circuit configured to generate two or more second pull-up control signals and two or more second pull-down control signals based on the second input data including two or more bits and the plurality of second voltage setting control signals; and a second driver circuit configured to generate the second output data signal based on the two or more second pull-up control signals and the two or more second pull-down control signals.

According to an example embodiment of the inventive concept, there is provided a method of generating a multi-level signal having one of three or more voltage levels that are different from each other, the method including: performing a voltage setting operation in which a first voltage interval and a second voltage interval are adjusted to be different from each other, wherein the first voltage interval represents a difference between a first pair of voltage levels among the three or more voltage levels and the second voltage interval represents a difference between a second pair of voltage levels among the three or more voltage levels; and generating an output data signal that is the multi-level signal based on input data including two or more bits and a result of the voltage setting operation.

DETAILED DESCRIPTION OF THE EMBODIMENTS

Figure 1:
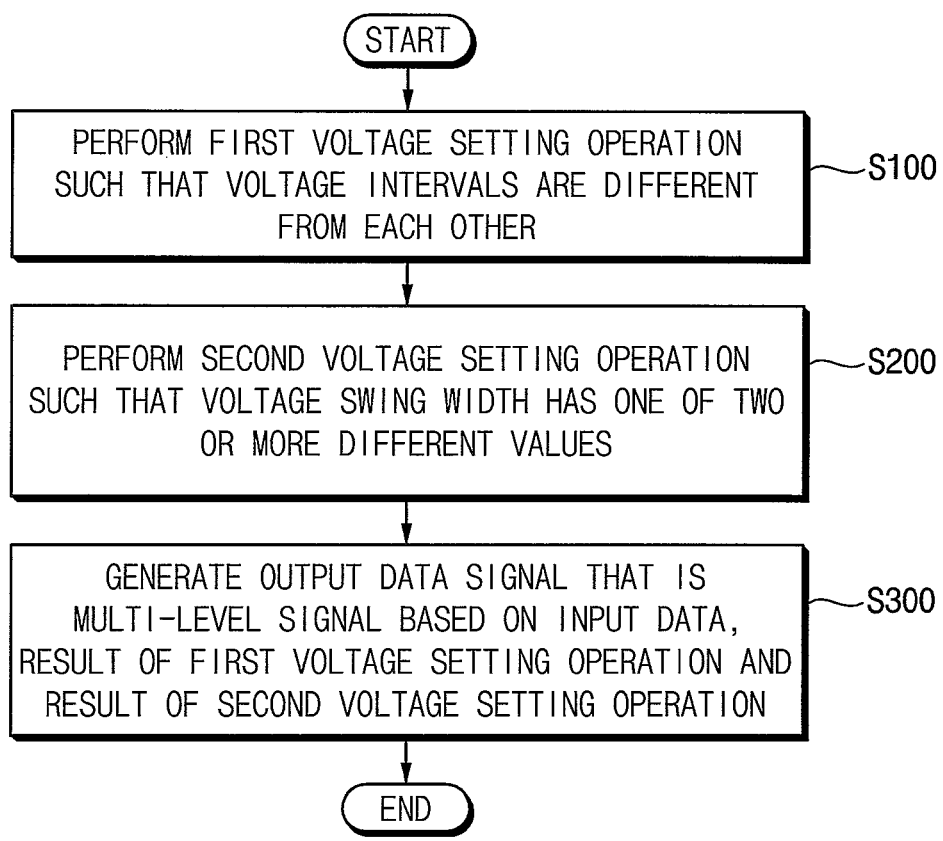
FIG. 1 is a flowchart illustrating a method of generating multi-level signal according example embodiments of the inventive concept.

Various example embodiments of the inventive concept will be described more fully with reference to the accompanying drawings. The present inventive concept may, however, be embodied in many different forms and should not be construed as limited to the embodiments set forth herein. Like reference numerals may refer to like elements throughout this application.

FIG. 1 is a flowchart illustrating a method of generating a multi-level signal according to example embodiments of the inventive concept.

Referring to FIG. 1, a method of generating a multi-level signal according to example embodiments of the inventive concept is performed to transmit or issue a multi-level signal that has one of three or more different voltage levels during one unit interval (UI), and is performed by a transmitter that generates or transmits the multi-level signal. The transmitter may be included in various communication systems and/or signal transmission systems, and may be included in, for example, a memory system. Configurations of the transmitter, the memory system and the multi-level signal will be described in detail later.

In the method of generating the multi-level signal according to example embodiments of the inventive concept, a first voltage setting operation for setting voltage intervals of the multi-level signal is performed (step S100). Each voltage interval represents a difference (e.g., a voltage difference or voltage level difference) between two adjacent voltage levels among the three or more voltage levels, and the first voltage setting operation is performed such that two or more voltage intervals are different from each other. For example, when or after the first voltage setting operation is performed, a first voltage interval and a second voltage interval may become different from each other. In addition, when or after the first voltage setting operation is performed, a third voltage interval may be different from the first and second voltage intervals.

A second voltage setting operation for setting a voltage swing width of the multi-level signal is performed (step S200). The voltage swing width represents a difference (e.g., a voltage difference or voltage level difference) between the lowest voltage level and the highest voltage level among the three or more voltage levels, and the second voltage setting operation is performed such that the voltage swing width is changed. For example, when or after the second voltage setting operation is performed, the voltage swing width may have one of two or more values that are different from each other.

An output data signal that is the multi-level signal is generated based on input data including two car more bits, a result of the first voltage setting operation and a result of the second voltage setting operation (step S300). For example, the input data may be multi-bit data for generating the multi-level signal. For example, in the output data signal, both the voltage intervals and the voltage swing width may be changed.

In some example embodiments of the inventive concept, the first and second voltage setting operations may be performed by adjusting or modifying at least one of the three or more voltage levels. In some example embodiments of the inventive concept, the first and second voltage setting operations may be substantially simultaneously or concurrently performed.

In the method of generating the multi-level signal according to example embodiments, the output data signal is generated based on a multi-level signaling scheme. The multi-level signaling scheme may be used compress the bandwidth required to transmit data at a given bit rate. In a simple binary scheme, two single symbols, usually two voltage levels, may be used to represent '1' and '0,' and thus the symbol rate may be equal to the bit rate. In contrast, the multi-level signaling scheme may use a larger alphabet of symbols to represent data, so that each symbol may represent more than one bit of data. As a result, the number of symbols that needs to be transmitted may be less than the number of bits (e.g., the symbol rate may be less than the bit rate), and thus the bandwidth may be compressed. The alphabet of symbols may be constructed from a number of different voltage levels. For example, in a four-level scheme, groups of two data bits may be mapped to one of four symbols. In this case, only one symbol needs to be transmitted for each pair of data bits, so the symbol rate may be a half of the bit rate.

In other words, the multi-level signaling scheme may be used to increase a data transmission (or transfer) rate without increasing the frequency of data transmission and/or a transmission power of the communicated data. An example of one type of the multi-level signaling scheme may be a pulse amplitude modulation (PAM) scheme, where a unique symbol of a multi-level signal may represent a plurality of bits of data. The number of possible pulse amplitudes in a digital PAM scheme may be a power of two. For example, there may be $2^2$ possible discrete pulse amplitudes in a 4-level PAM (e.g., PAM4), there may be $2^3$ possible discrete pulse amplitudes in an 8-level PAM (e.g., PAM8), and there may be $2^4$ possible discrete pulse amplitudes in a 6-level PAM (e.g., PAM 16). However, example embodiments of the inventive concept are not limited thereto, and the inventive concept may be applied to or employed with a K-level PAM (e.g., PAM(K)) having K possible pulse amplitudes, where K is a natural number greater than or equal to three.

In the method of generating the multi-level signal according to example embodiments of the inventive concept, a selective or adaptive level change scheme may be implemented. In the selective level change scheme, at least some of all voltage intervals of the output data signal may be changed by changing a specific voltage level among all possible voltage levels of the output data signal. In addition, the voltage swing width may be changed when the voltage intervals of the output data signal are changed. Accordingly, as compared to a case where all voltage intervals are equal to each other and the voltage swing width is fixed, the signal characteristic at the receiver may be efficiently improved or enhanced.

Figure 2:
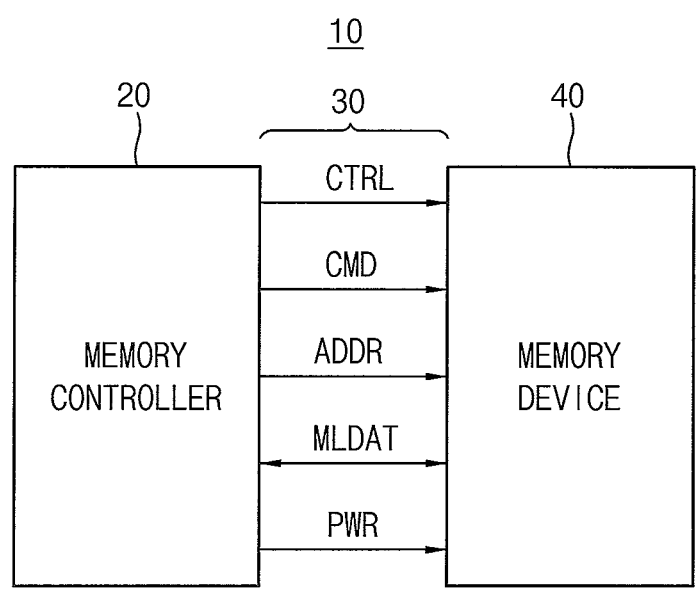
FIG. 2 block diagram illustrating a memory system according to example embodiments of the inventive concept.

FIG. 2 is a block diagram illustrating a memory system according to example embodiments of the inventive concept.

Referring to FIG. 2, a memory system 10 includes a memory controller 20 and a memory device 40. The memory system 10 may further include a plurality of signal lines 30 that electrically connect the memory controller 20 with the memory device 40.

The memory device 40 is controlled by the memory controller 20. For example, based on requests from a host, the memory controller 20 may store (e.g., write or program) data into the memory device 40, or may retrieve (e.g., read or sense) data from the memory device 40.

The plurality of signal lines 30 may include control lines, command lines, address lines, data input/output (I/O) lines and power lines. The memory controller 20 may transmit a command CMD, an address ADDR and a control signal CTRL to the memory device 40 via the command lines, the address lines and the control lines, may exchange a data signal MLDAT with the memory device 40 via the data I/O lines, and may transmit a power supply voltage PWR to the memory device 40 via the power lines. For example, the data signal MLDAT may be the multi-level signal that is generated and transmitted according to example embodiments of the inventive concept. The plurality of signal lines 30 may further include data strobe signal (DQS) lines for transmitting a DQS signal.

In some example embodiments of the inventive concept, at least a part or all of the plurality of signal lines 30 may be referred to as a channel. The term "channel" may represent signal lines that include the data I/O lines for transmitting the data signal MLDAT. However, example embodiments of the inventive concept are not limited thereto, and the channel may further include the command lines for transmitting the command CMD and/or the address lines for transmitting the address ADDR.

Figure 3A:
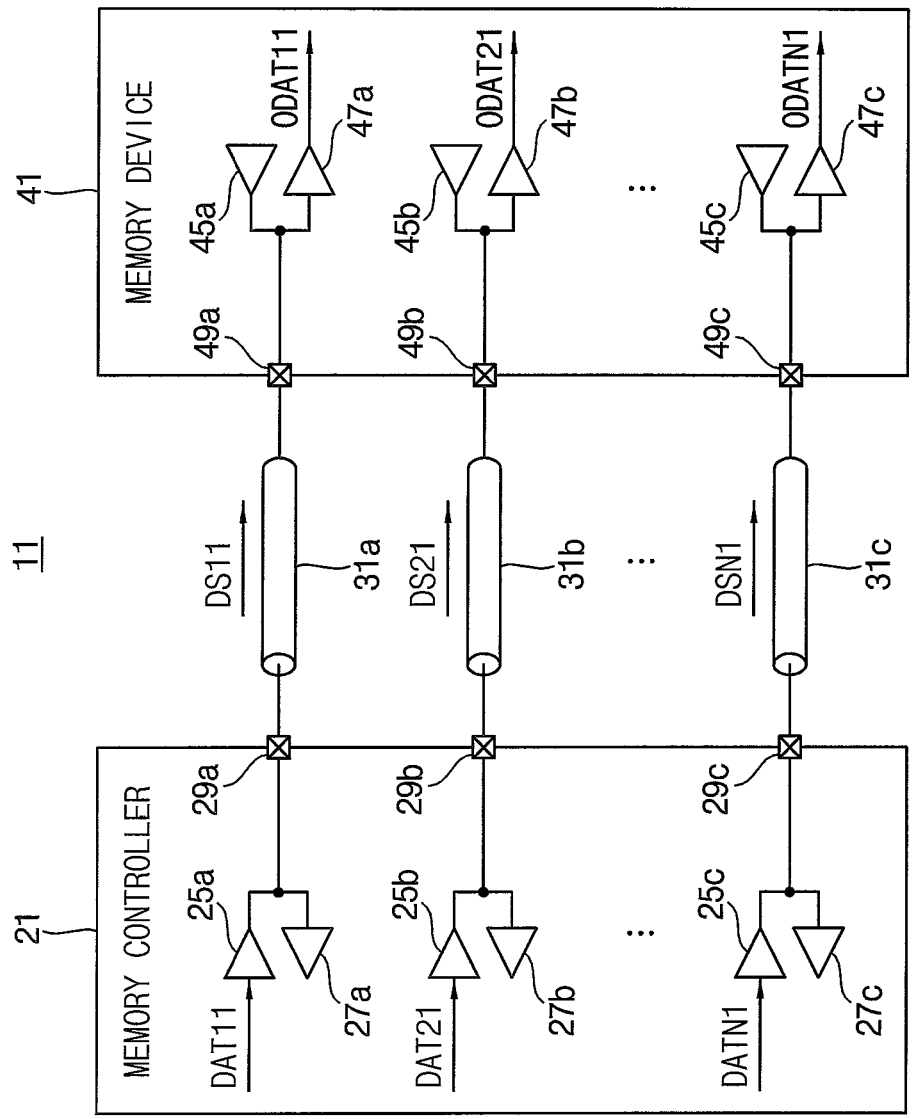
FIGS. 3A and 3B are block diagrams illustrating an example of a memory system of FIG. 2.
Figure 3B:
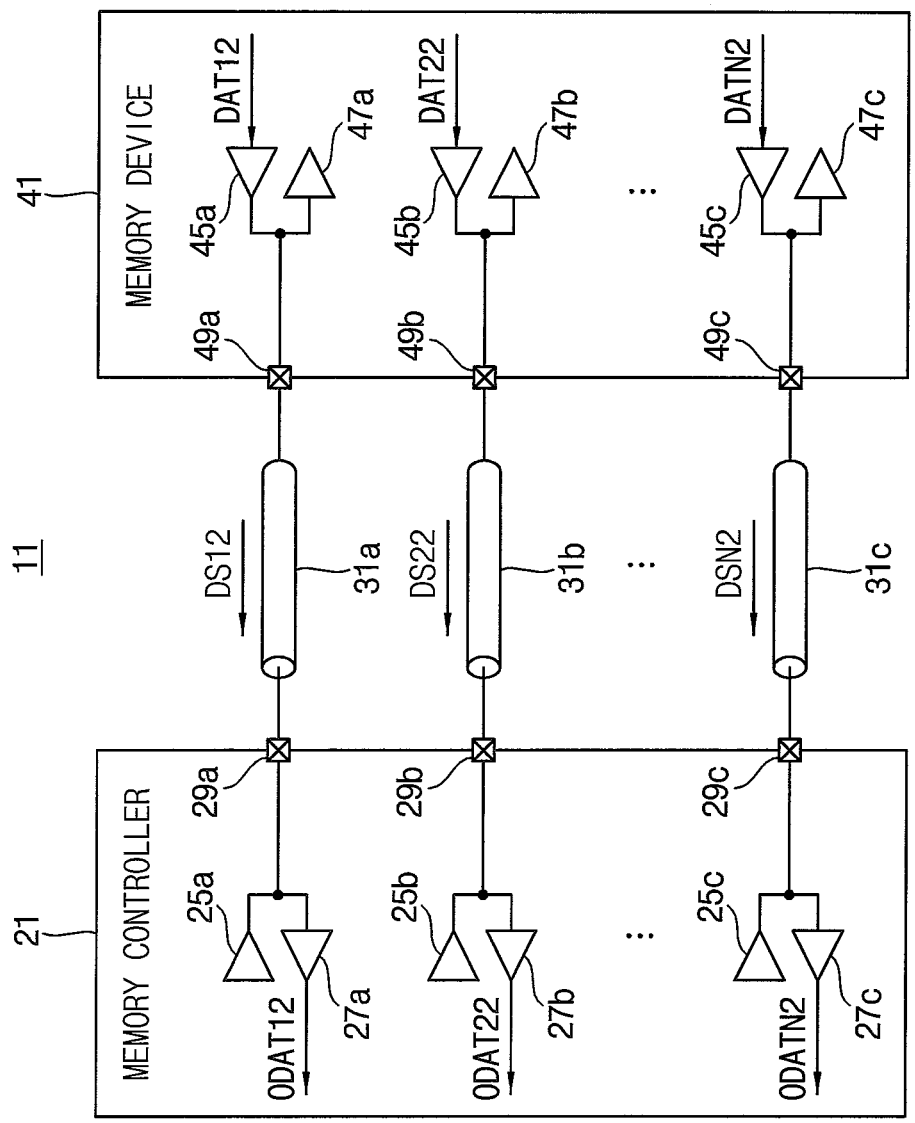

FIGS. 3A and 3B are block diagrams illustrating an example of a memory system of FIG. 2.

Referring to FIGS. 3A and 3B, a memory system 11 includes a memory controller 21, a memory device 41 and a plurality of channels 31a, 31b and 31c. For example, the number of the channels 31a, 31b and 31c may be N, where N is a natural number greater than or equal to two.

The memory controller 21 may include a plurality of transmitters 25a, 25b and 25c, a plurality of receivers 27a, 27b and 27c, and a plurality of data I/O pads 29a, 29b and 29c. The memory device 41 may include a plurality of transmitters 45a, 45b and 45c, a plurality of receivers 47a, 47b and 47c, and a plurality of data I/O pads 49a, 49b and 49c.

Each of the plurality of transmitters 25a, 25b, 25c, 45a, 45b and 45c may generate a multi-level signal, may perform the method of generating a multi-level signal according to example embodiments of the inventive concept described with reference to FIG. 1 and/or a method of generating a multi-level signal according to example embodiments of the inventive concept which will be described with reference to FIGS. 10, 11 and 13, and may be a transmitter according to example embodiments of the inventive concept which will be described with reference to FIGS. 7 and 15. Each of the plurality of receivers 27a, 27b, 27c, 47a, 47b and 47c may receive the multi-level signal. The plurality of transmitters 25a, 25b, 25c, 45a, 45b and 45c and the plurality of receivers 27a, 27b, 27c, 47a, 47b and 47c may perform a method of transmitting data according to example embodiments of the inventive concept which will be described with reference to FIGS. 16 and 17 through the plurality of channels 31a, 31b and 31c.

Each of the plurality of data I/O pads 29a, 29b, 29c, 49a, 49b and 49c may be connected to a respective one of the plurality of transmitters 25a, 25b, 25c, 45a, 45b and 45c and a respective one of the plurality of receivers 27a, 27b, 27c, 47a, 47b and 47c. For example, the data I/O pad 29a may be connected to the transmitter 25a and the receiver 27a and the data I/O pad 49c may be connected to the transmitter 45c and the receiver 47c.

The plurality of channels 31a, 31b and 31c may connect the memory controller 21 with the memory device 41. Each of the plurality of channels 31a, 31b and 31c may be connected to a respective one of the plurality of transmitters 25a, 25b and 25c and a respective one of the plurality of receivers 27a, 27b and 27c through a respective one of the plurality of data I/O pads 29a, 29b and 29c. In addition, each of the plurality of channels 31a, 31b and 31c may be connected to a respective one of the plurality of transmitters 45a, 45b and 45c and a respective one of the plurality of receivers 47a, 47b and 47c through a respective one of the plurality of data I/O pads 49a, 49b and 49c. For example, the channel 31a may be connected to the transmitter 25a via the data I/O pad 29a and the transmitter 45a via the data I/O pad 49a. The multi-level signal may be transmitted through each of the plurality of channels 31a, 31b and 31c.

FIG. 3A illustrates an operation of transferring data from the memory controller 21 to the memory device 41. For example, the transmitter 25a may generate art output data signal DS11, which is the multi-level signal, based on input data DAT11, the output data signal DS11 may be transmitted from the memory controller 21 to the memory device 41 through the channel 31a, and the receiver 47a may receive the output data signal DS11 to obtain data ODAT11 corresponding to the input data DAT11. Similarly, the transmitter 25b may generate an output data signal DS21, which is the multi-level signal, based on input data DAT21, the output data signal DS21 may be transmitted to the memory device 41 through the channel 31b, and the receiver 47b may receive the output data signal DS21 to obtain data ODAT21 corresponding to the input data DAT21. The transmitter 25c may generate an output data signal DSN1, which is the multi-level signal, based on input data DATN1, the output data signal DSN1 may be transmitted to the memory device 41 through the channel 31c, and the receiver 47c may receive the output data signal DSN1 to obtain data ODATN1 corresponding to the input data DATN1. For example, the input data DAT11, DAT21 and DATN1 may be write data to be written into the memory device 41.

FIG. 3B illustrates an operation of transferring data from the memory device 41 to the memory controller 21. For example, the transmitter 45a may generate an output data signal DS12, which is the multi-level signal, based on input data DAT12, the output data signal DS12 may be transmitted from the memory device 41 to the memory controller 21 through the channel 31a, and the receiver 27a may receive the output data signal DS12 to obtain data ODAT12 corresponding to the input data DAT12. Similarly, the transmitter 45b may generate an output data signal DS22, which is the multi-level signal, based on input data DAT22, the output data signal DS22 may be transmitted to the memory controller 21 through the channel 31b, and the receiver 27b may receive the output data signal DS22 to obtain data ODAT22 corresponding to the input data DAT22. The transmitter 45c may generate an output data signal DSN2, which is the multi-level signal, based on input data DATN2, the output data signal DSN2 may be transmitted to the memory controller 21 through the channel 31c, and the receiver 27c may receive the output data signal DSN2 to obtain data ODATN2 corresponding to the input data DATN2. For example, the input data DAT12, DAT22 and DATN2 may be read data retrieved from the memory device 41.

Figure 4:
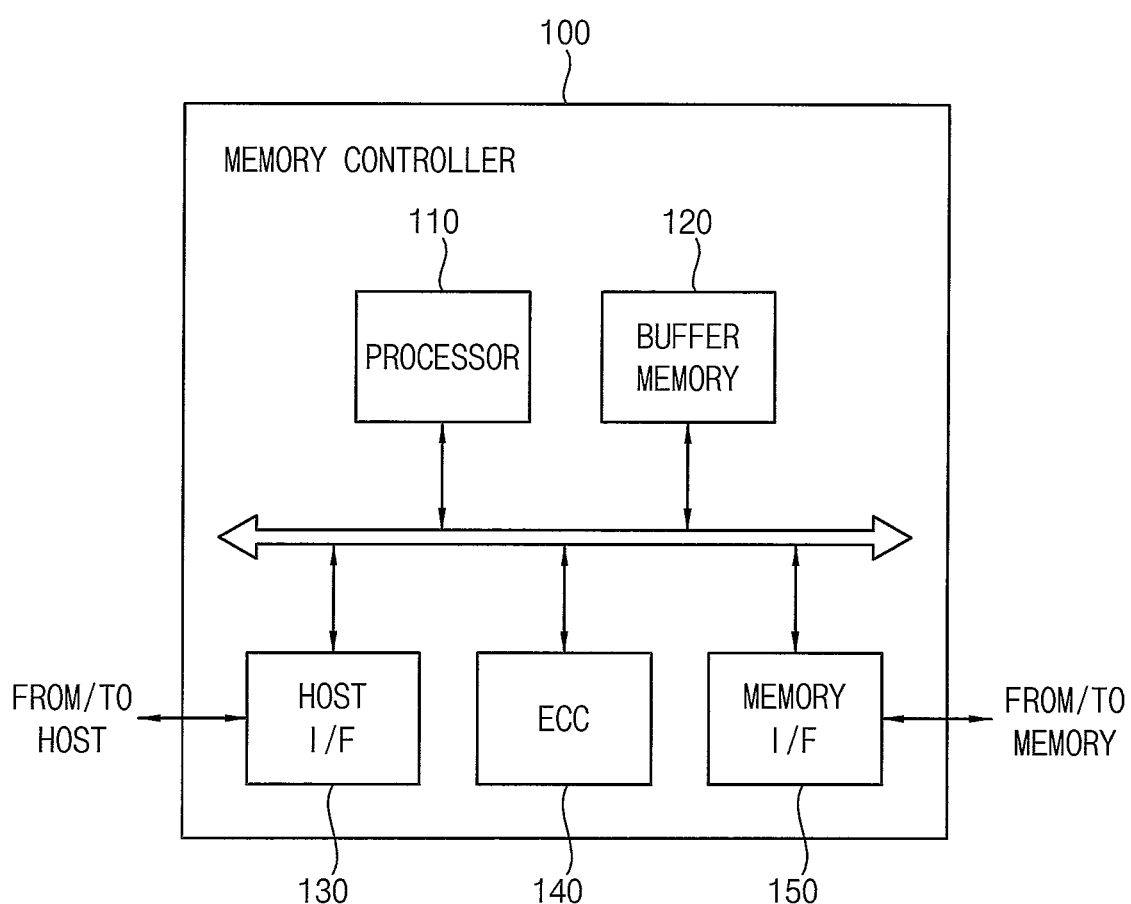
FIG. 4 is a block diagram illustrating an example of a memory controller included in a memory system according to example embodiments of the inventive concept.

FIG. 4 is a block diagram illustrating an example of a memory controller included in a memory system according to example embodiments of the inventive concept.

Referring to FIG. 4, a memory controller 100 may include at least one processor 110, a buffer memory 120, a host interface 130, an error correction code (FCC) block 140 and a memory interface 150.

The processor 110 may control an operation of the memory controller 100 in response to a command and/or request received via the host interface 130 from an external host. For example, the processor 110 may control respective components by employing firmware for operating a memory device (e.g., the memory device 40 in FIG. 2).

The buffer memory 120 may store instructions and data executed and processed by the processor 110. For example, the buffer memory 120 may be implemented with a volatile memory device such as a dynamic random access memory (DRAM), a static random access memory (SRAM), a cache memory, or the like.

The host interface 130 may provide physical connections between the host and the memory controller 100. The host interface 130 may provide an interface corresponding to a bus format of the host for communication between the host and the memory controller 100. In some example embodiments of the inventive concept, the bus format of the host may be a small computer system interface (SCSI) or a serial attached SCSI (SAS) interface. In other example embodiments of the inventive concept, the bus format of the host may be a universal serial bus (USB), a peripheral component interconnect (PCI), a PCI express (PCIe), an advanced technology attachment (ATA), a parallel ATA (PATA), a serial ATA (SATA), a nonvolatile memory (NVM), an NVM express (NVMe) etc., format.

The ECC block 140 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The memory interface 150 may exchange data with the memory device (e.g., the memory device 40 in FIG. 2). The memory interface 150 may transmit a command and an address to the memory device, and may transmit data to the memory device or receive data read from the memory device. A transmitter (e.g., the transmitter 25a in FIG. 3A) that generates the multi-level signal according to example embodiments of the inventive concept and a receiver (e.g., the receiver 27a in FIG. 3A) that receives the multi-level signal may be included the memory interface 150. It is to be understood that the inventive concept is not limited thereto and at least two of the transmitters 25a to 25c and receivers 27a to 27c in FIG. 3A may be included in the memory interface 150.

Figure 5:
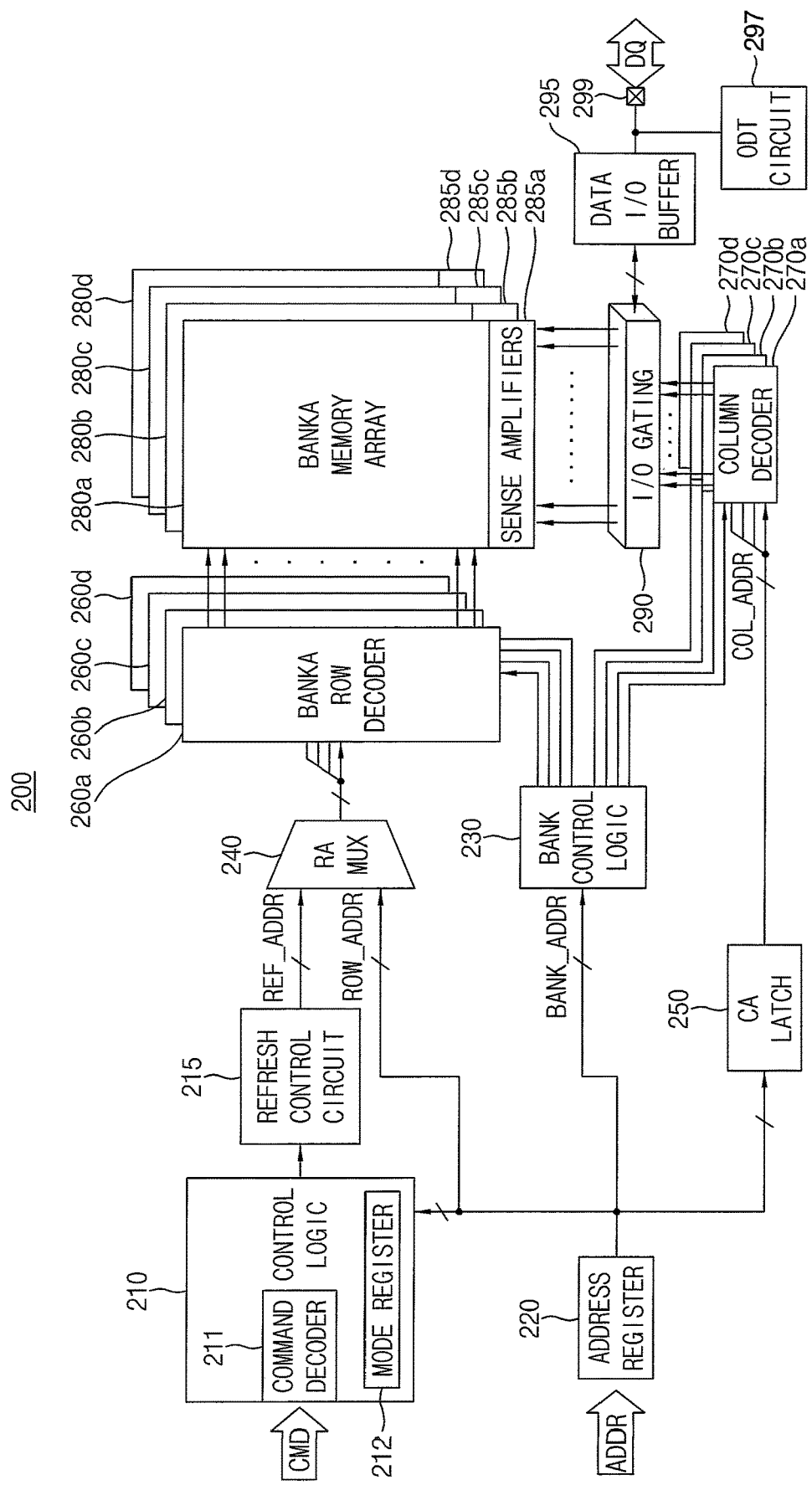
FIG. 5 is a block diagram illustrating an example of a memory device include in a memory system according to example embodiments of the inventive concept.

FIG. 5 is a block diagram illustrating an example of a memory device included in a memory system according to example embodiments of the inventive concept.

Referring to FIG. 5, a memory device 200 includes a control logic 210, a refresh control circuit 215, an address register 220, a bank control logic 230, a row address multiplexer 240, a column address latch 250, a row decoder, a column decoder, a memory cell array, a sense amplifier unit, an input/output (I/O) gating circuit 290, a data I/O buffer 295, an on-die termination (ODT) circuit 297 and a data I/O pad 299. In some example embodiments, the memory device 200 may be, e.g., a volatile memory device. For example, the memory device 200 may be one of various volatile memory devices such as a dynamic random access memory (DRAM).

The memory cell array may include a plurality of memory cells. The memory cell array may include a plurality of bank arrays, e.g., first through fourth bank arrays 280a, 280b, 280c and 280d. The row decoder may include a plurality of bank row decoders, e.g., first through fourth bank row decoders 260a, 260b, 260c and 260d connected to the first through fourth bank arrays 280a, 280b, 280c and 280d, respectively. The column decoder may include a plurality of bank column decoders, e.g., first through fourth bank column decoders 270a, 270b, 270c and 270d connected to the first through fourth bank arrays 280a, 280b, 280c and 280d, respectively. The sense amplifier unit may include a plurality of bank sense amplifiers, e.g., first through fourth bank sense amplifiers 285a, 285b, 285c and 285d connected to the first through fourth bank arrays 280a, 280b, 280c and 280d, respectively.

The first through fourth bank arrays 280a~280d, the first through fourth bank row decoders 260a~260d, the first through fourth bank column decoders 270a~270d, and the first through fourth bank sense amplifiers 285a~285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank and the fourth bank array 280d, the fourth bank row decoder 260d, the fourth bank column decoder 270d, and the fourth bank sense amplifier 285d may form the fourth bank.

The address register 220 may receive an address ADDR including a bank address BANK_ADDR, a row address ROW_ADDR and a column address COL_ADDR from a memory controller (e.g., the memory controller 20 in FIG. 2). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to receipt of the bank address BANK_ADDR. One of the first through fourth bank row decoders 260a~260d corresponding to the received bank address BANK_ADDR may be activated in response to the bank control signals generated by the bank control logic 230, and one of the first through fourth bank column decoders 270a~270d corresponding to the received bank address BANK_ADDR may be activated in response to the bank control signals generated by the bank control logic 230. In other words, the bank control signals may be provided to the at least one of the first through fourth bank row decoders 260a~260d and at least one of the first through fourth bank column decoders 270a~270d.

The refresh control circuit 215 may generate a refresh address REF_ADDR in response to receipt of a refresh command or entrance of any self refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to at least one of the first through fourth bank row decoders 260a~260d.

The activated one of the first through fourth bank row decoders 260a~260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to at least one of the first through fourth bank column decoders 270a~270d.

The activated one of the first through fourth bank column decoders 270a~270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, the I/O gating circuit 290 may include an input data mask logic, read data latches for storing data output from the first through fourth bank arrays 280a~280d, and write drivers for writing data to the first through fourth bank arrays 280a~260d.

Data DQ to be read from one of the first through fourth bank arrays 280a~280d may be sensed by a sense amplifier coupled to the one bank array, and may be stored in the read data latches. The data DQ stored in the read data latches may be provided to the memory controller (e.g., the memory controller 20 in FIG. 2) via the data I/O buffer 295 and the data I/O pad 299. Data DQ received via the data I/O pad 299 that are to be written to one of the first through fourth bank arrays 280a~280d may be provided from the memory controller to the data I/O buffer 295. The data DQ received via the data I/O pad 299 and provided to the data buffer 295 may be written to the one bank array via the write drivers in the I/O gating circuit 290. A transmitter (e.g., the transmitter 45a in FIG. 3A) that generates the multi-level signal according to example embodiments of the inventive concept and a receiver (e.g., the receiver 47a in FIG. 3A) that receives the multi-level signal may be included in the data I/O buffer 295. It is to be understood that the inventive concept is not limited thereto and at least two of the transmitters 45a to 45c and receivers 49a to 49c in FIG. 3A may be included in the memory interface 150.

The control logic 210 may control an operation of the memory device 200. For example, the control logic 210 may generate control signals for the memory device 200 to perform a data write operation or a data read operation. The control logic 210 may include a command decoder 211 that decodes a command CMD received from the memory controller and a mode register 212 that sets an operation mode of the memory device 200.

The ODT circuit 297 may be connected to the data I/O pad 299 and the data I/O buffer 295. When the ODT circuit 297 is enabled, an ODT operation may be performed. The ODT operation may reduce (and/or prevent) a signal from being reflected by using a termination resistor to improve signal integrity.

Although the memory device included in the memory system according to example embodiments of the inventive concept is described based on a DRAM, the memory device according to example embodiments of the inventive concept may be any volatile memory device, and/or any nonvolatile memory device, e.g., a flash memory, a phase change random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Hereinafter, example embodiments of the inventive concept will be described in detail based on various examples of the multi-level signaling scheme (e.g., the PAM scheme) and various examples of the transmitter according thereto.

Figure 6A:
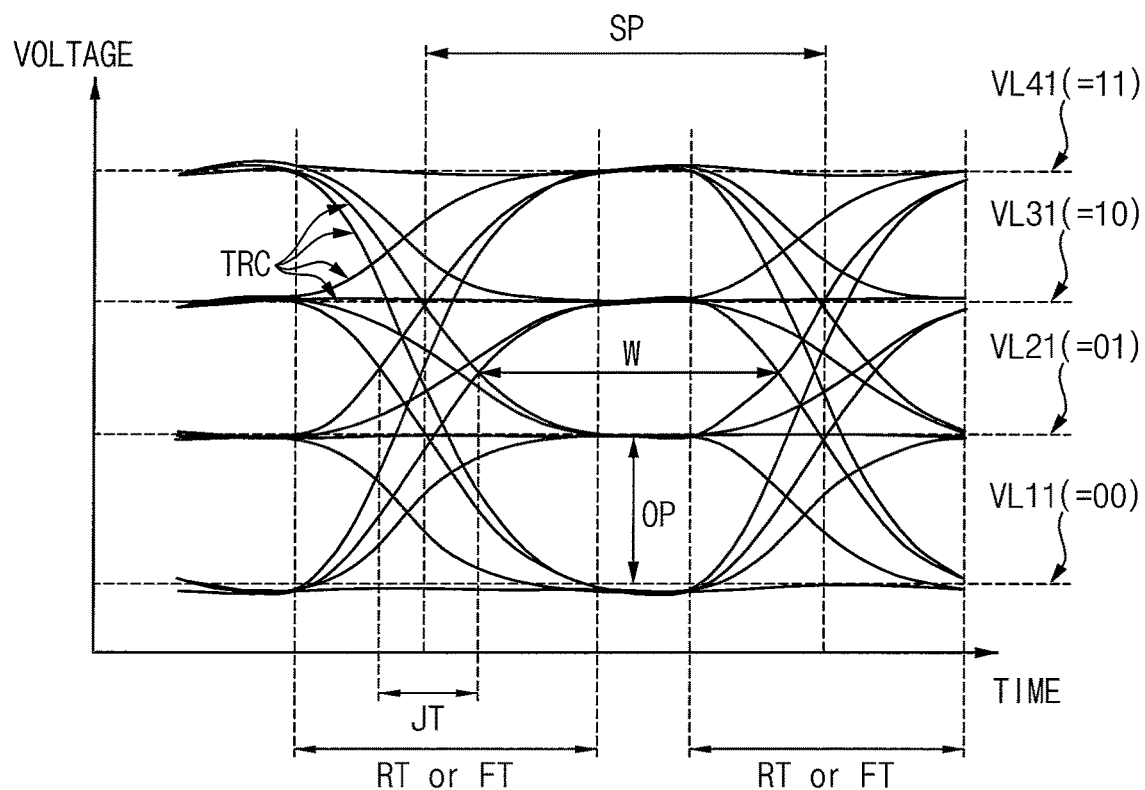
FIGS. 6A and 6B are diagrams for describing a data signal generated by a method of generating a multi-level signal according to example embodiments of the inventive concept.
Figure 6B:
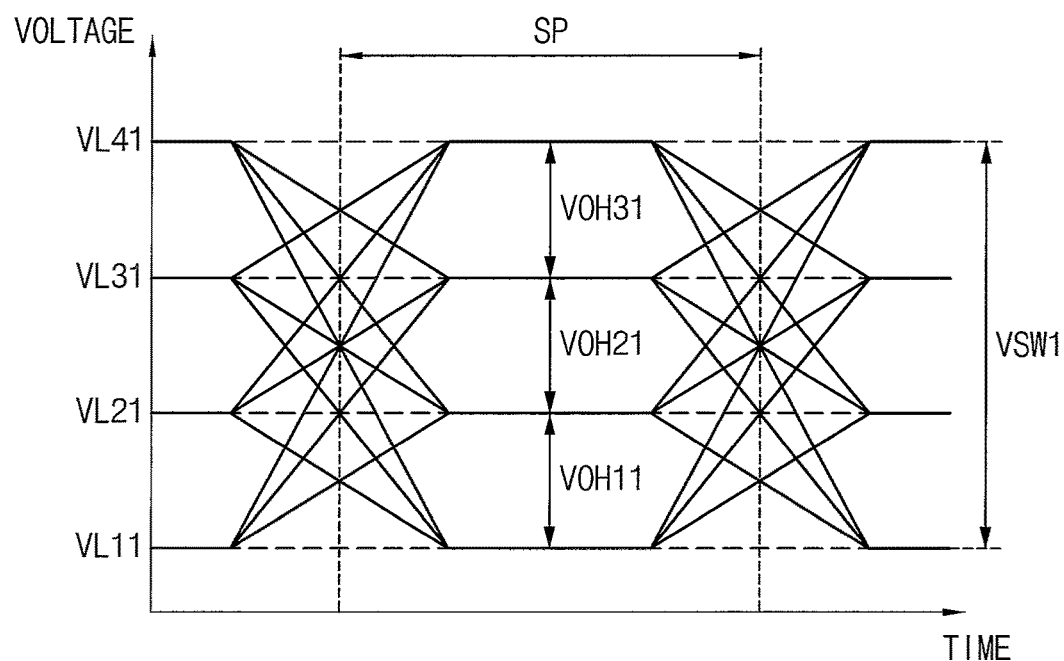

FIGS. 6A and 6B are diagrams for describing a data signal generated by a method of generating a multi-level signal according to example embodiments of the inventive concept.

FIG. 6A illustrates an ideal eye diagram of a data signal (e.g., a PAM4 signal) generated based on the 4-level scheme (e.g., the PAM4 scheme). FIG. 6B is a simplified diagram illustrating the eye diagram of FIG. 6A.

Referring to FIG. 6A, an eye diagram may be used to indicate the quality of signals in high-speed transmissions. For example, the eye diagram may represent four symbols of a signal (e.g., '00,' '01,' '10' and '11'), and each of the four symbols may be represented by a respective one of different voltage levels (e.g., voltage amplitudes) VL11, VL21, VL31 and VL41. For example, the symbol '00' may be represented by voltage level VL11 and the symbol '01' may be represented by voltage level VL21. The eye diagram may be used to provide a visual indication of the health of the signal integrity, and may indicate noise margins of the data signal.

To generate the eye diagram, an oscilloscope or other computing device may sample digital signal according to a sample period SP (e.g., a unit interval or a bit period). The sample period SP may be defined by a clock associated with the transmission of the measured signal. The oscilloscope or other computing device may measure the voltage level of the signal during the sample period SP to form a plurality of traces TRC. Various characteristics associated with the measured signal may be determined by overlaying the plurality of traces TRC.

The eye diagram may be used to identify a number of characteristics of a communication signal such as jitter, crosstalk, electromagnetic interference (EMI), signal loss, signal-to-noise ratio (SNR), other characteristics, or combinations thereof.

For example, a width W of an eye in the eye diagram may be used to indicate a timing synchronization of the measured signal or jitter effects of the measured signal. For example, the eye diagram may indicate an eye opening OP, which represents a peak-to-peak voltage difference between the various voltage levels VL11, VL21, VL31 and VL41. The eye opening OP may be related to a voltage margin for discriminating between different voltage levels VL11, VL21, VL31 and VL41 of the measured signal. The eye opening OP may correspond to the voltage interval described with reference to FIG. 1. In other words, the eye opening OP may correspond to the difference between adjacent voltage levels. For example, the eye opening OP may correspond to the difference between a pair of adjacent voltage levels, say VL11 and VL21. For example, the eye diagram may be used to identify a rise time RT and/or a fall time FT for transitions from a first amplitude to a second amplitude. The rise time RT or the fall time FT may indicate a time required for transitioning from one voltage level to another voltage level, and may be related to or associated with a rising edge and a falling edge, respectively. The slope of the trace TRC during the rise time RT or the fall time FT may indicate the sensitivity of the signal to timing error, among other things. For example, the eye diagram may be used to identify an amount of jitter JT in the measured signal. The jitter JT may refer to a timing error that results from a misalignment of rise and fall times. The jitter JT may occur when the rising edge or the falling edge occurs at a time that is different from an ideal time defined by the data clock. The jitter JT may be caused by signal reflections, intersymbol interference, crosstalk, process-voltage-temperature (PVT) variations, random jitter, additive noise, or combinations thereof.

Referring to FIG. 6B, different first, second, third and fourth voltage levels VL11, VL21, VL31 and VL41 of the data signal that is the PAM4 signal are illustrated, different first, second and third voltage intervals VOH11, VOH21 and VOH31 of the data signal are illustrated, and a voltage swing width VSW1 of the data signal is illustrated.

The first voltage level VL11 that is the lowest voltage level may be lower than the second voltage level VL21, the second voltage level VL21 may be lower than the third voltage level VL31, and the third voltage level VL31 may be lower than the fourth voltage level VL41 that is the highest voltage level. In addition, the first voltage interval VOH11 may represent a difference between the first and second voltage levels VL11 and VL21, the second voltage interval VOH21 may represent a difference between the second and third voltage levels VL21 and VL31, the third voltage interval VOH31 may represent a difference between the third and fourth voltage levels VL31 and VL41, and the voltage swing width VSW1 may represent a difference between the first and fourth voltage levels VL11 and VL41.

Figure 7:
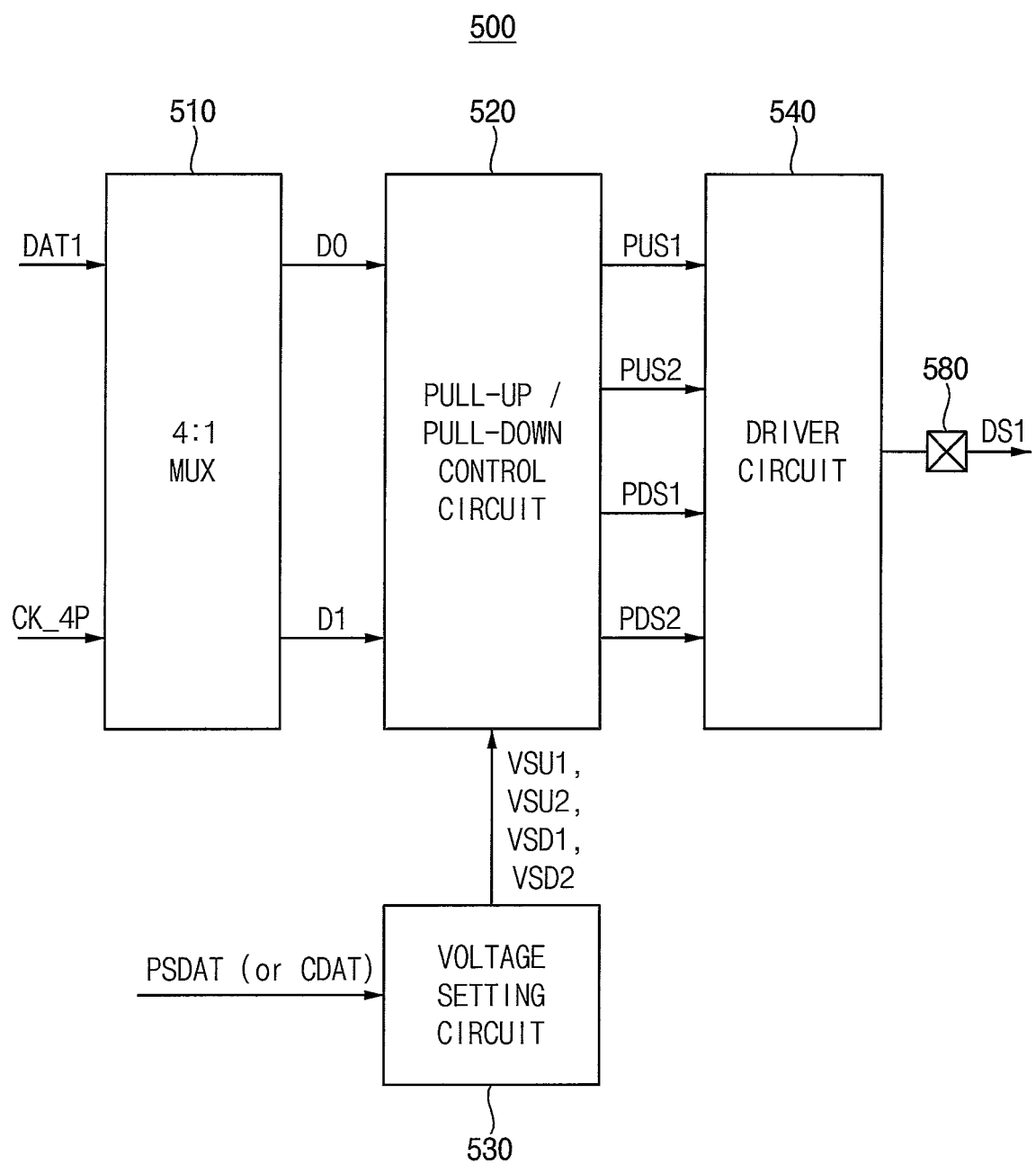
FIG. 7 is a block diagram illustrating a transmitter according to example embodiments of the inventive concept.

FIG. 7 is a block diagram illustrating a transmitter according to example embodiments of the inventive concept.

Referring to FIG. 7, a transmitter 500 includes a pull-up/pull-down control circuit 520, a voltage setting circuit 530 and a driver circuit 540. The transmitter 500 may further include a multiplexer 510 and a data I/O pad 580.

The multiplexer 510 may receive input data DAT1 including two or more bits D0 and D1, and may divide the input data DAT1 into the two or more bits D0 and D1. The pull-up/pull-down control circuit 520 generates two or more pull-up control signals PUS1 and PUS2 and two or more pull-down control signals PDS1 and PDS2 based on the input data DAT1 (e.g., the two or more bits D0 and D1) and a plurality of voltage setting, control signals VSU1, VSU2, VSD1 and VSD2. The voltage setting circuit 530 performs a first voltage setting operation for setting voltage interval of a multi-level signal and a second voltage setting operation for setting a voltage swing width of the multi-level signal, and generates the plurality of voltage setting control signals VSU1, VSU2, VSD1 and VSD2 that represent a result of the first voltage setting operation and a result of the second voltage setting operation. The driver circuit 540 generates an output data signal DS1 that is the multi-level signal based on the two or more pull-up control signals PUS1 and PUS2 and the two or more pull-down control signals PDS1 and PDS2. The data I/O pad 580 may output the output data signal DS1.

The multi-level signal has one of three or more different voltage levels. When the first voltage setting operation is performed, the result is that two or more voltage intervals each of which represents a difference between two adjacent voltage levels are different from each other. For example, a first voltage interval and a second voltage interval may become different from each other. In reference to FIG. 6B, the first voltage interval VOH11 and the second voltage interval VOH21 may become different. When the second voltage setting operation is performed, the voltage swing width which represents a difference between the lowest and highest voltage levels is changed. In other words, in reference to FIG. 6B, the voltage swing width VSW1 may be changed. For example, the voltage swing width may have one of two or more different values. For example, the first and second voltage setting operations may be performed by adjusting at least one of the three or more voltage levels. For example, by adjusting the second voltage level VL21, the first voltage interval VOH11 and the second voltage interval VOH11 may change. In other words, the transmitter 500 may perform the method of generating the multi-level signal according to example embodiments of the inventive concept described with reference to FIG. 1.

Based on setting data PSDAT or characteristic data CDAT, the voltage setting circuit 530 may select at least one voltage level to be adjusted and may generate the voltage setting control signals VSU1, VSU2, VSD1 and VSD2. In other words, a target for performing the first and second voltage setting operations may be determined based on the setting data PSDAT or the characteristic data CDAT. The setting data PSDAT and the characteristic data CDAT may represent a characteristic of a channel that transmits the output data signal DS1. For example, the setting data PSDAT may be obtained in advance (e.g., pre-obtained) and stored internally, and the characteristic data CDAT may be obtained in real time (or during runtime) and provided from an outside. In some example embodiments of the inventive concept, the target for performing the first and second voltage setting operations may be determined in advance (e.g., predetermined) based on the setting data PSDAT. In other example embodiments of the inventive concept, the target for performing the first and second voltage setting operations may be determined in real time based on the characteristic data CDAT. For example, as will be described with reference to FIGS. 18A and 18B, the characteristic data CDAT may be provided from an eye monitor circuit at the receiver.

In an example of FIG. 7, the input data DAT1 may include a first bit D0 and a second bit D1 that are different from each other, and the multiplexer 510 may divide the input data DAT1 into the first bit D0 and the second bit D1 based on a four-phase clock signal CK_4P. The output data signal DS1 may correspond to the data signal illustrated in FIGS. 6A and 6B, and may have one of the first, second, third and fourth voltage levels VL11, VL21, VL31 and VL41, that are different from each other, during one unit interval. The first and second voltage setting operations may be performed by adjusting at least one of the first to fourth voltage levels VL11, VL21, VL31 and VL41.

In some example embodiments of the inventive concept, the first bit D0 may be a least significant bit (LSB) of the input data DAT1, and the second bit D1 may be a most significant bit (MSB) of the input data DAT1. In this example, the pull-up/pull-down control circuit 520 may generate the first pull-up control signal PUS1 and the first pull-down control signal PDS1 based on the first bit D and the voltage setting control signals VSU1 and VSD1, and may generate the second pull-up control signal PUS2 and the second pull-down control signal PDS2 based on the second bit D1 and the voltage setting control signals VSU2 and VSD2. The first pull-up control signal PUS1, the first pull-down control signal PDS1 and the voltage setting control signals VSU1 and VSD1 may be control signals for the LSB, and the second pull-up control signal PUS2, the second pull-down control signal PDS2 and the voltage setting control signals VSU2 and VSD2 may be control signals for the MSB. As will be described with reference to FIG. 8B, the pull-up and pull-down control signals PUS1, PUS2, PDS1 and PDS2 may be control codes for controlling turn-on and turn-off of transistors.

In some example embodiments of the inventive concept, the voltage setting circuit 530 may perform only the first setting operation, and the plurality of voltage setting control signals VSU1, VSU2, VSD1 and VSD2 generated by the voltage setting circuit 530 may represent only the result of the first voltage setting operation. In other words, the transmitter 500 may perform the method of generating the multi-level signal according to example embodiments of the inventive concept which will be described with reference to FIGS. 10 and 11.

FIGS. 8A, 8B, 8C, 8D and 8E are diagrams illustrating examples of a driver circuit included in a transmitter of FIG. 7.

Figure 8A:
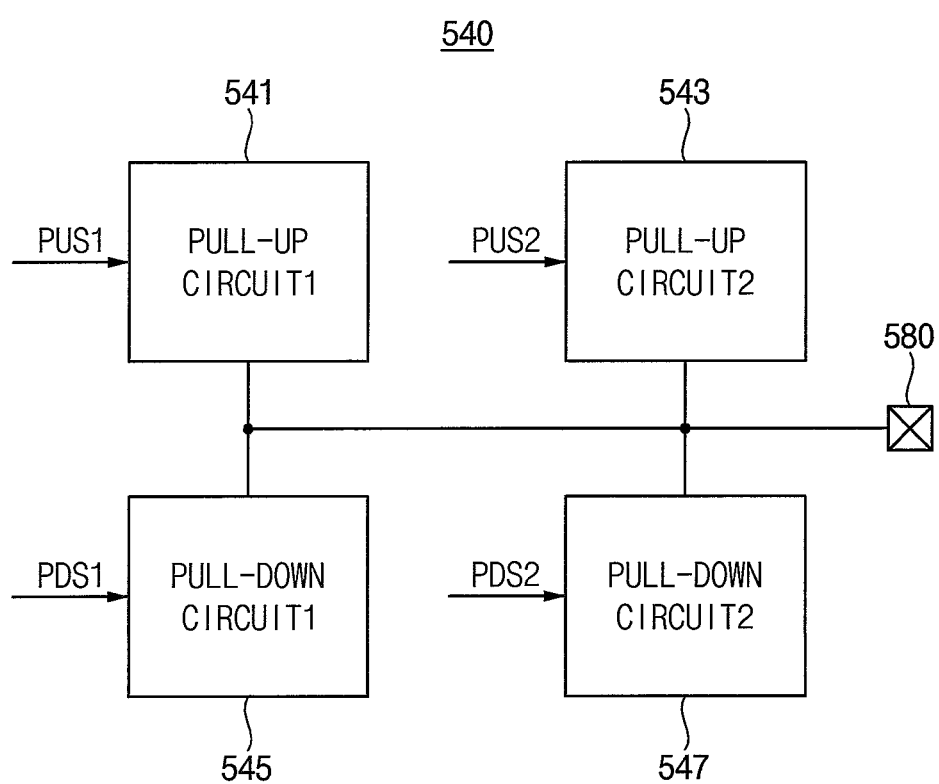
FIGS. 8A, 8B, 8C, 8D and 8E are diagrams illustrating examples of a driver circuit included in a transmitter of FIG. 7.

Referring to FIG. 8A, the driver circuit 540 may include a first pull-up circuit 541, a second pull-up circuit 543, a first pull-down circuit 545 and a second pull-down circuit 547.

The first pull-up circuit 541 may pull up the data I/O pad 580 based on the first pull-up control signal PUS1. In other words, the first pull-up circuit 541 may pull up the data I/O pad 580 in response to the first pull-up control signal PUS1. The second pull-up circuit 543 may pull up the data I/O pad 580 based on the second pull-up control signal PUS2. In other words the second pull-up circuit 543 may pull up the data I/O pad 580 in response to the second pull-up control signal PUS2. For example, the first pull-up control signal PUS1 may be a pull-up control code for the LSB that is generated based on the first voltage setting control signal VSU1, and the second pull-up control signal PUS2 may be a pull-up control code for the MSB that is generated based on the second voltage setting control signal VSU2.

The first pull-down circuit 545 may pull down the data I/O pad 580 based on the first pull-down control signal PDS1. In other words, the first pull-down circuit 545 may pull down the data I/O pad 580 in response to the first pull-down control signal PDS1. The second pull-down circuit 547 may pull down the data I/O pad 580 based on the second pull-down control signal PDS2. In other words, the second pull-down circuit 547 may pull down the data I/O pad 580 in response to the second pull-down control signal PDS2. For example, the first pull-down control signal PDS1 may be a pull-down control code for the LSB that is generated based on the third voltage setting control signal VSD1, and the second pull-down control signal PDS2 may be a pull-down control code for the MSB that is generated based on the fourth voltage setting control signal VSD2.

In some example embodiments of the inventive concept, as described above, the first pull-up control signal PUS1 and the first voltage setting control signal VSU1 may be the control signals for the LSB, the second pull-up control signal PUS2 and the second voltage setting control signal VSU2 may be the control signals for the MSB, and thus a driving capability of the second pull-up circuit 543 to pull up the data I/O pad 580 may be greater than (e.g., approximately twice as large as) a driving capability of the first pull-up circuit 541 to pull up the data I/O pad 580. Similarly, a driving capability of the second pull-down circuit 547 to pull down the data I/O pad 580 may be greater than a driving capability of the first pull-down circuit 545 to pull down the data I/O pad 580.

Figure 8B:
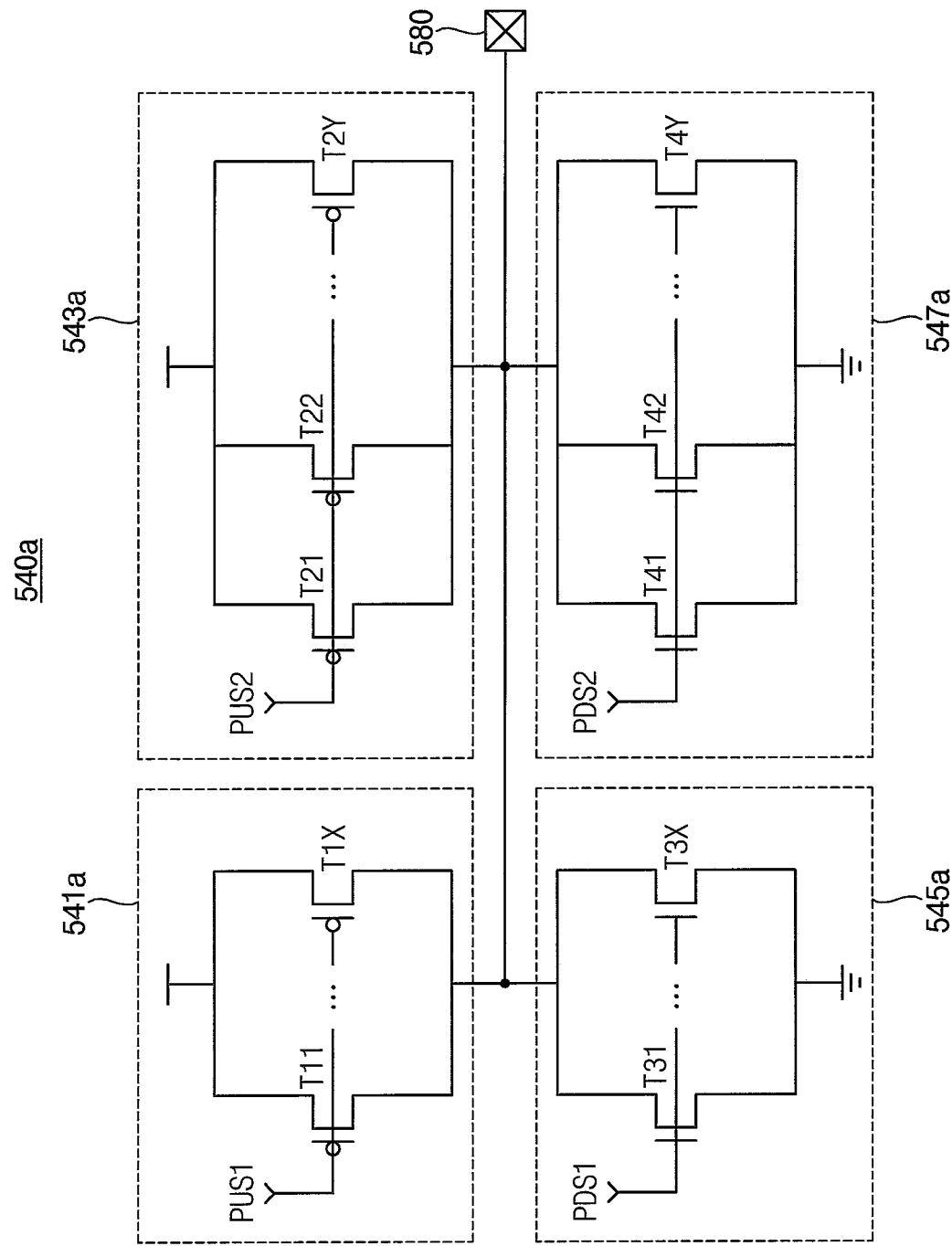

Referring to FIG. 8B, a driver circuit 540a may include a first pull-up circuit 541a, a second pull-up circuit 543a, a first pull-down circuit 545a and a second pull-down circuit 547a.

The first pull-up circuit 541a may include a plurality of first pull-up transistors T11, . . . , T1X that are connected in parallel between a power supply voltage and the data I/O pad 580. The plurality of first transistors T11, . . . , T1X may be selectively turned on based on the first pull-up control signal PUS1.

The second pull-up circuit 543a may include a plurality of second pull-up transistors T21, T22, . . . , T2Y that are connected in parallel between the power supply voltage and the data I/O pad 580. The plurality of second pull-up transistors T21, T22, . . . , T2Y may be selectively turned on, based on the second pull-up control signal PUS2.

When it is required to pull up the output data signal DS1 to the second voltage level VL21, the first pull-up circuit 541a may be enabled or activated by turning on at least some of the plurality of first pull-up transistors T11, . . . , T1X based on the first pull-up control signal PUS1. In this case, the second voltage level VL21 may be adjusted by controlling the number (or quantity) of the plurality of first pull-up transistors T11, . . . , T1X that are turned on. For example, the second voltage level VL21 may increase as the number of the plurality of first pull-up transistors T11, . . . , T1X that are turned on increases. In other words, if just one of the plurality of first pull-up transistors T11, . . . , T1X is turned on at a first time, the second voltage level VL21 may have a first value, and if another one of the plurality of first pull-up transistors T11, . . . , T1X is turned on at a second time so that two of the plurality of first pull-up transistors T11, . . . , T1X are turned on, the second voltage level VL21 may have a second value greater than the first value. Similarly, when it is required to pull up the output data signal DS1 to the third voltage level VL31, the second pull-up circuit 543a may be enabled based on the second pull-up control signal PUS2, and the third voltage level VL31 may be adjusted by controlling the number of the plurality of second pull-up transistors T21, T22, . . . , T2Y that are turned on. When it is required to pull up the output data signal DS1 to the fourth voltage level VL41, both the first and second pull-up circuits 541a and 543a may be simultaneously enabled based on the first and second pull-up control signals PUS1 and PUS2, and the fourth voltage level VL41 may be adjusted by controlling the number of the plurality of first pull-up transistors T11, . . . , T1X and the plurality of second pull-up transistors T21, T22, . . . , T2Y that are turned on. When at least one of the second, third and fourth voltage levels VL21, VL31 and VL41 are adjusted as described above, the voltage intervals and the voltage swing width may be adjusted.

The first pull-down circuit 545a may include a plurality of first pull-down transistors T31, . . . , T3X that are connected in parallel between the data I/O pad 580 and a ground voltage. The plurality of first pull-down transistors T31, . . . , T3X may be selectively turned on based on the first pull-down control signal PDS1.

The second pull-down circuit 547a may include a plurality of second pull-down transistors T41, T42, . . . , T4Y that are connected in parallel between the data I/O pad 580 and the ground voltage. The plurality of second pull-down transistors T41, T42, . . . , T4Y may be selectively turned on based on the second pull-down control signal PDS2.

Operations of the first and second pull-down circuits 545a and 547a may be similar to the operations of the first and second pull-up circuits 541a and 543a. For example, when it is required to pull down the output data signal DS1 to the third voltage level VL31, the first pull-down circuit 545a may be enabled based on the first pull-down control signal PDS1. When it is required to pull down the output data signal DS1 to the second voltage level VL21, the second pull-down circuit 547a may be enabled based on the second pull-down control signal PDS2. When it is required to pull down the output data signal DS1 to the first voltage level VL11, both the first and second pull-down circuits 545a and 545a may be simultaneously enabled based on the first and second pull-down control signals PDS1 and PDS2. In these cases, at least one of the first, second and third voltage levels VL11, VL21 and VL31 may be adjusted by controlling the number of the plurality of first pull-down transistors T31, . . . , T3X that are turned on and/or by con oiling the number of the plurality of second pull-down transistors T41, T42, . . . , T4Y that are turned on, and thus the voltage intervals and the voltage swing width may be adjusted.

In some example embodiments of the inventive concept, the first and second pull-up transistors T11, T1X, T21, T22 and T2Y may be p-type metal oxide semiconductor (PMOS) transistors, and the first and second pull-down transistors T31, T3X, T41, T42 and T4Y may be n-type metal oxide semiconductor (NMOS) transistors. However, the inventive concept is not limited thereto. For example, the first and second pull-up circuits 541a and 543a may further include at least one NMOS transistor. In other words, at least one of the PMOS transistors included in the first and second pull-up circuits 541a and 543a may be replaced with an NMOS transistor. Similarly, the first and second pull-down circuits 545a and 547a may further include at least one PMOS transistor. In other words, at least one of the NMOS transistors included in the first and second pull-down circuits 545a and 547a may be replaced with a PMOS transistor. In some example embodiments of the inventive concept, the number and/or size of transistors may be changed such that the driving capability of the first and second pull-up circuits 541a and 543a and the driving capability of the first and second pull-down circuits 545a and 545b are different from each other.

Figure 8C:
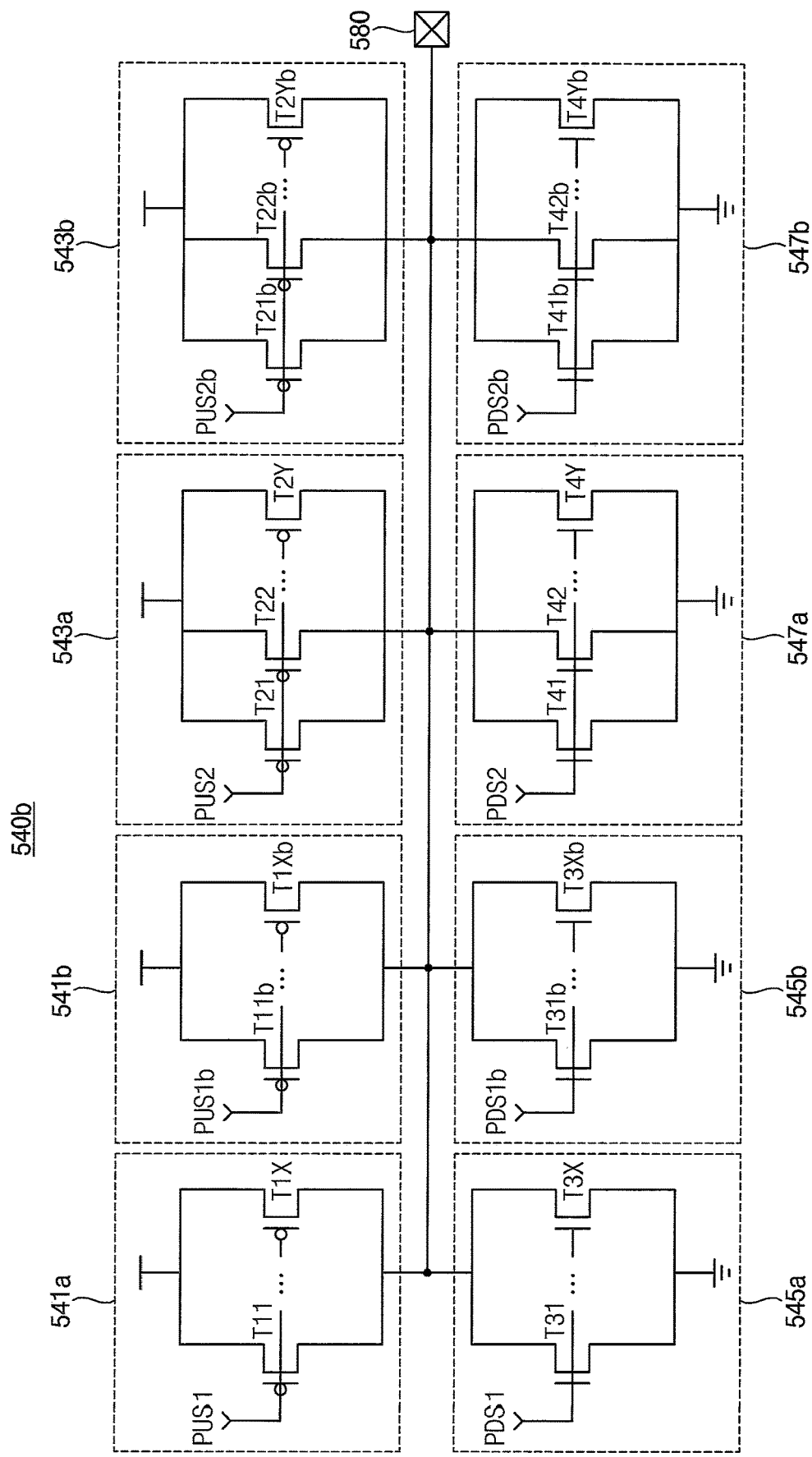

Referring FIG. 8C, a driver circuit 540b may include first pull-up circuits 541a and 541b, second pull-up circuits 543a and 543b, first pull-down circuits 545a and 545b, and second pull-down circuits 547a and 547b. The descriptions for elements similar to those shown in FIG. 8B may be omitted.

As compared with the driver circuit 540a of FIG. 8B, the driver circuit 540b may further include the pull-up circuits 541b and 543b and the pull-down circuits 545b and 547b. The pull-up circuits 541b and 543b and the pull-down circuits 545b and 547b may be similar to the pull-up circuits 541a and 543a and the pull-down circuits 545a and 547a, respectively. The pull-up circuits 541b and 543b may include pull-up transistors T11b, . . . , T1Xb, T21b, T22b, . . . , T2Yb that are selectively turned on based on pull-up control signals PUS1b and PUS2b. The pull-down circuits 545a and 547a may include pull-down transistors T31b, T3Xb, ..., T41b, T42b, ..., T4Yb that are selectively turned on based on pull-down control signals PDS1b and PDS2b. In this example, the voltage intervals and the voltage swing width may be adjusted variously (e.g., more precisely and/or finely).

Figure 8D:
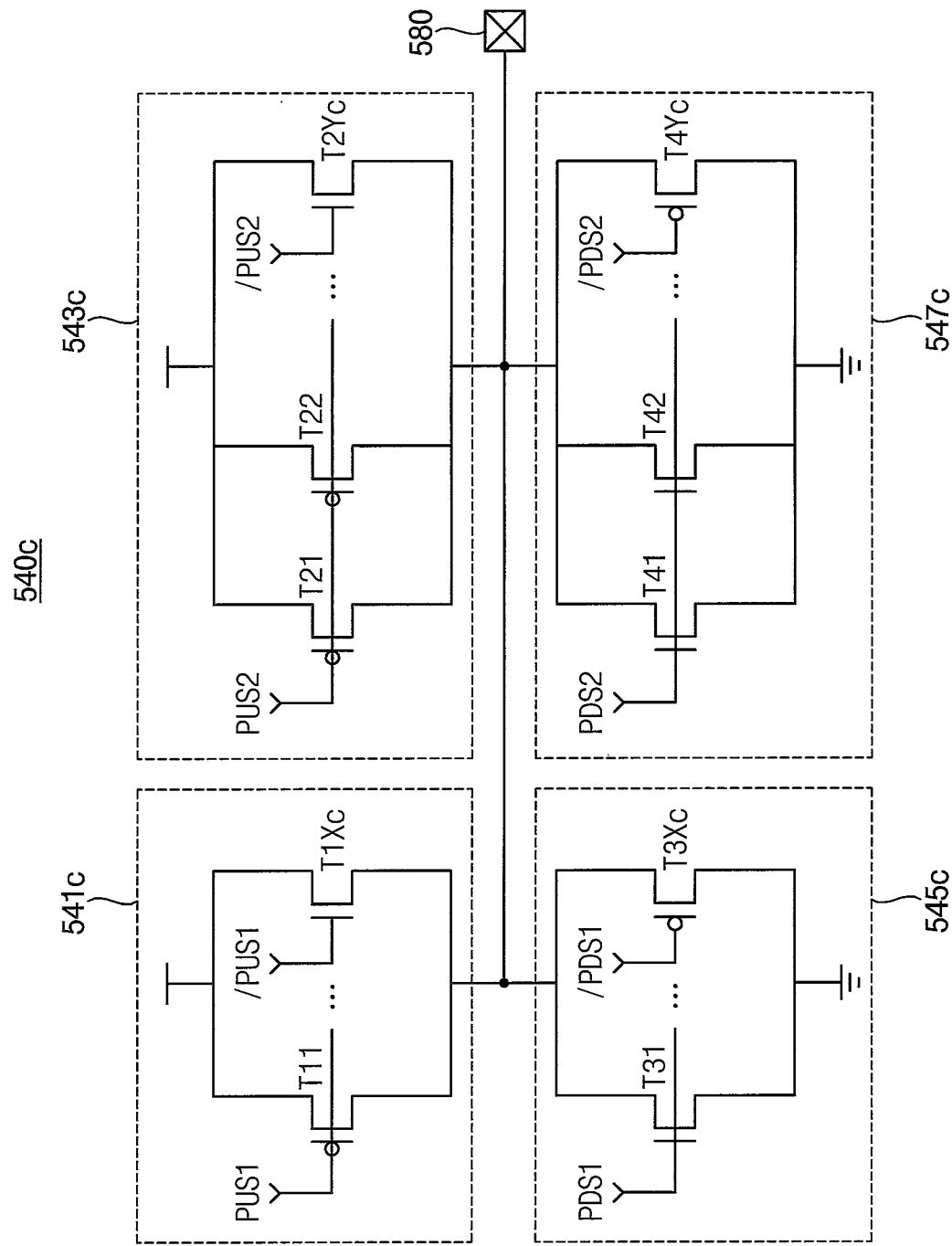

Referring to FIG. 8D, a driver circuit 540c may include a first pull-up circuit 541c, a second pull-up circuit 543c, a first pull-down circuit 545c and a second pull-down circuit 547c. The descriptions for elements similar to those shown in FIG. 8B may be omitted.

As compared with the driver circuit 540a of FIG. 8B, the PMOS transistors T1X and T2Y included in the first and second pull-up circuits 541e and 543c may be replaced with NMOS transistors T1Xc and T2Yc in the driver circuit 540e, and the NMOS transistors T3X and T4Y included in the first and second pull-down circuits 545c and 547c may be replaced with PMOS transistors T3Xc and T4Yc in the driver circuit 540c. For example, pull-up control signals/ PUS1 and/PUS2 applied to the NMOS transistors T1Xc and T2Yc may be different from (e.g., have phases opposite to those of) the pull-up control signals PUS1 and PUS2, and pull-down control signals/PDS1 and/PDS2 applied to the NMOS transistors T3Xc and T4Yc may be different from (e.g., have phases opposite to those of) the pull-down control signals PDS1 and PDS2. In this example, the voltage intervals and the voltage swing width may be adjusted variously (e.g., more precisely and/or finely).

Figure 8E:
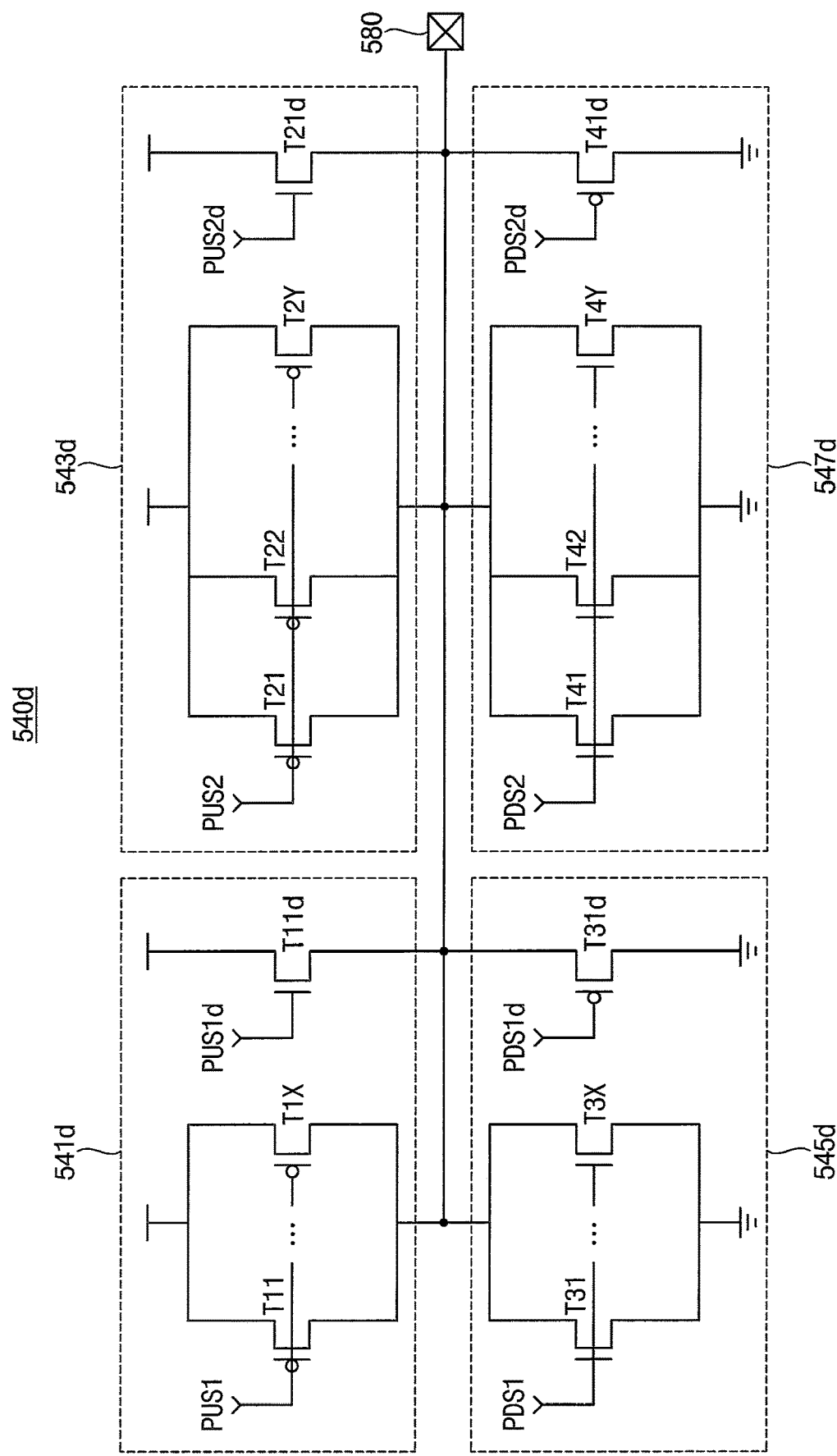

Referring to FIG. 8E, a driver circuit 540d may include a first pull-up circuit 541d, a second pull-up circuit 543d, a first pull-down circuit 545d and a second pull-down circuit 547d. The descriptions for elements similar to those shown in FIG. 8B may be omitted.

As compared with the driver circuit 540a of FIG. 8B, the first and second pull-up circuits 541d and 543d may further include NMOS transistors T11d and T21d in the driver circuit 540d, and the first and second pull-down circuits 545d and 547d may further include PMOS transistors T31d and T41d in the driver circuit 540d. For example, pull-up control signals PUS1d and PUS2d applied to the NMOS transistors T11d and T21d may be different from (e.g., have phases different from those of) the pull-up control signals PUS1 and PUS2, and pull-down control signals PDS1d and PDS2d applied to the PMOS transistors T31d and T41d may be different from (e.g., have phases different from those of) the pull-down control signals PDS1 and PDS2. In this example, the voltage intervals and the voltage swing width may be adjusted variously (e.g., more precisely and/or finely).

Figure 9A:
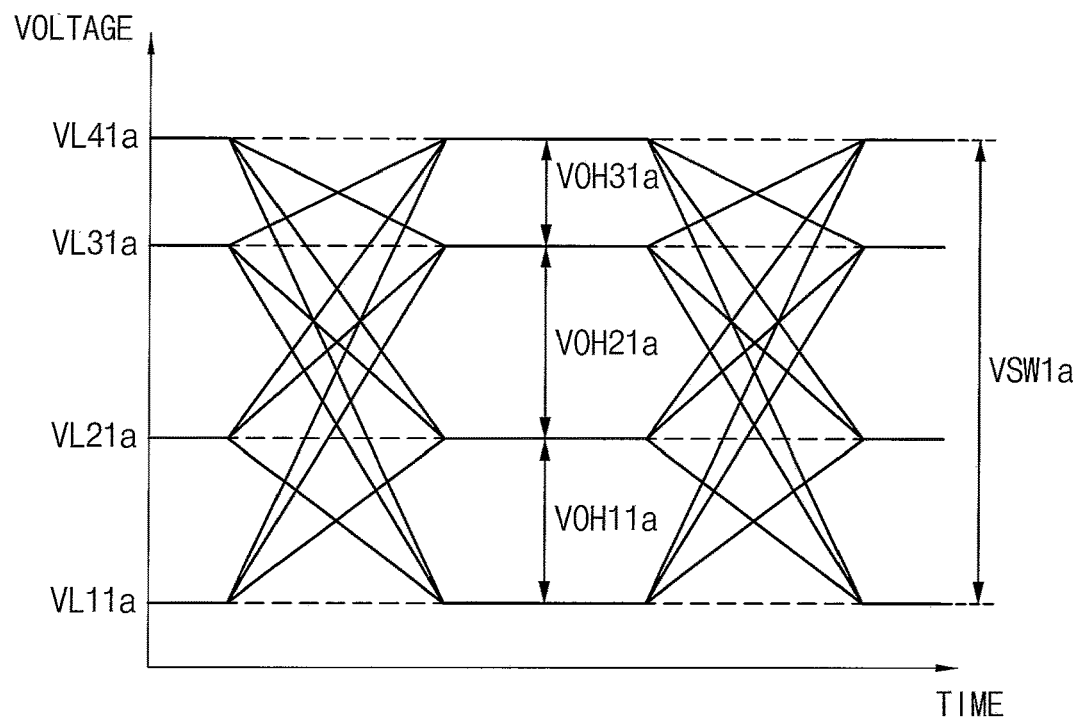
FIGS. 9A and 9B are diagrams for describing operations performed by a method of generating a multi-level signal and a transmitter according to example embodiments of the inventive concept.
Figure 9B:
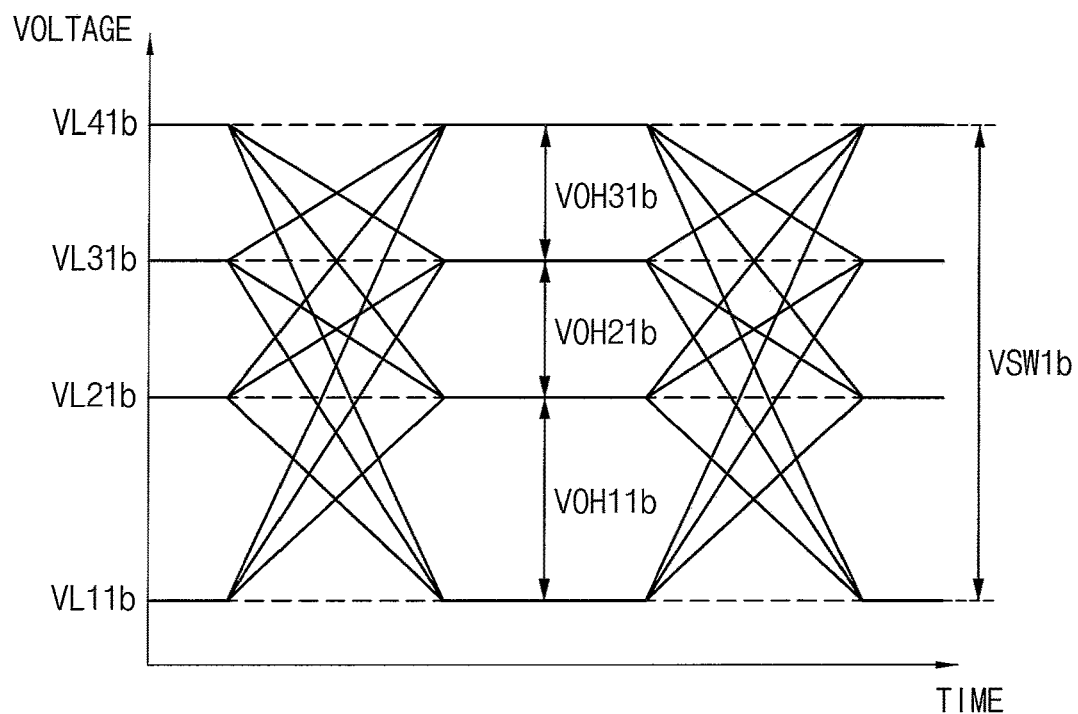

FIGS. 9A and 9B are diagrams for describing operations performed by a method of generating a multi-level signal and a transmitter according to example embodiments of the inventive concept.

Referring to FIG. 9A, as the voltage interval adjustment and the voltage swing width adjustment are performed on the output data signal, voltage levels VL11a, VL21a, VL31a and VL41a may be adjusted, and voltage intervals VOH11a, VOH21a and VOH31a and a voltage swing width VSW1a may be changed. As compared with the example of FIG. 6B, the first and second voltage intervals VOH11a and VOH21a and the voltage swing width VSW1a may increase in an example of FIG. 9A, and the third voltage interval VOH31a may decrease in the example of FIG. 9A. In addition, in the example of FIG. 9A, the first, second and third voltage intervals VOH11a, VOH21a and VOH31a may be different from each other, and the first voltage interval VOH11a may be less than the second voltage interval VOH21a and may be larger than the third voltage interval VOH31a.

Referring to FIG. 9B, as the voltage interval adjustment and the voltage swing width adjustment are performed on the output data signal, voltage levels VL11b, VL21b, VL31b and VL41b may be adjusted, and voltage intervals VOH11b, VOH21b and VOH31b and a voltage swing width VSW1b may be changed. As compared with the example of FIG. 6B, the first voltage interval VOH11b and the voltage swing width VSW1b may increase in an example of FIG. 9B, and the second and third voltage intervals VOH21b and VOH31b may decrease in the example of FIG. 9B. In addition, in the example of FIG. 9B, the first voltage interval VOH11b may be larger than the second and third voltage intervals VOH21b and VOH31b, and the second and third voltage intervals VOH21b and VOH31b may be equal to each other.

Even if the transmitter generates and transmits the data signal such that all the voltage intervals VOH11, VOH21 and VOH31 are set to be equal to each other as illustrated in FIG. 6B, the voltage intervals may be changed at the receiver and the eye characteristics may be deteriorated or degraded at the receiver, due to the characteristics of the channel and the variation on the data signal. When the transmitter generates and transmits the data signal such that at least two of the voltage intervals are set to be different from each other to suit the characteristics of the channel and the voltage swine width is also changed to suit the characteristics of the channel according to example embodiments of inventive concept, the signal characteristics at the receiver may be efficiently improved or enhanced.

Figure 10:
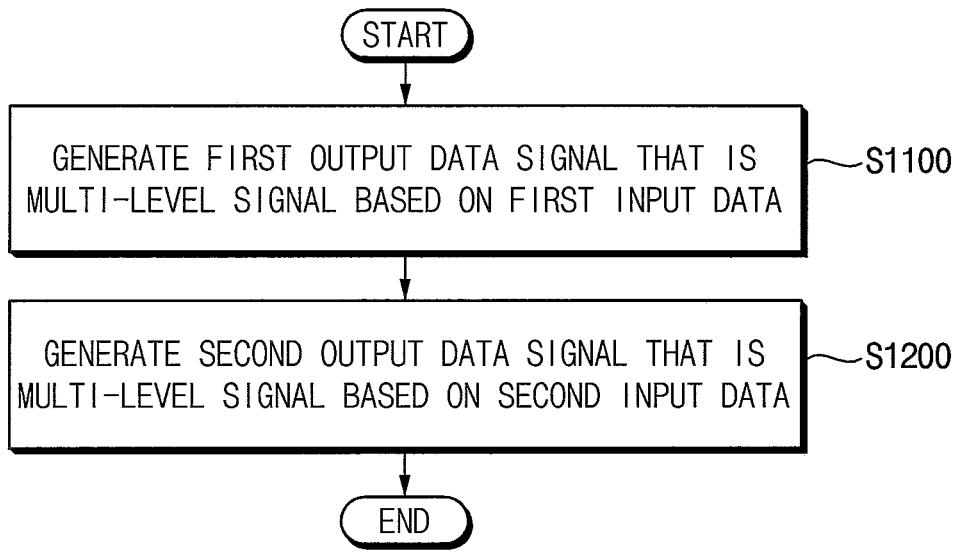
FIG. 10 is a flowchart illustrating a method of generating a multi-level signal according to example embodiments of the inventive concept.

FIG. 10 is a flowchart illustrating a method of generating a multi-level signal according to example embodiments of the inventive concept.

Referring to FIG. 10, in a method of generating a multi-level signal according to example embodiments of the inventive concept, a first output data signal that is the multi-level signal is generated based on first input data including two or more bits and a result of at least one voltage setting operation (step S1100). A second output data signal that is the multi-level signal is generated based on second input data including two or more bits and a result of at least one voltage setting operation (step S1200).

Figure 11:
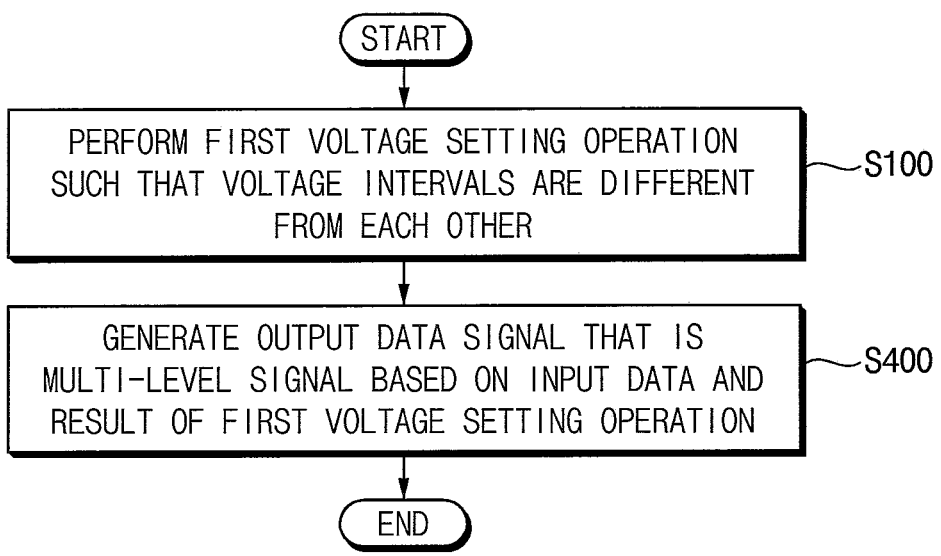
FIG. 11 is a flowchart illustrating an example of step S1100 or step S1200 in FIG. 10.

FIG. 11 is a flowchart illustrating an example of step S1100 or step S1200 in FIG. 10. The descriptions corresponding to those already made for FIG. 1 will be omitted.

Referring to FIGS. 10 and 11, when venerating the first output data signal (step S1100), or when generating the second output data signal (step S1200), a first voltage setting operation for adjusting voltage intervals of the multi-level signal is performed (step S100). For example, in step S100 the voltage intervals may be set to be different from each other. The output data signal that is the multi-level signal is generated based on the input data and a result of the first voltage setting operation (step S400).

Step S100 in FIG. 11 may be substantially the same as step S100 in FIG. 1, and step S400 in FIG. 11 may be similar to step S300 in FIG. 1. For example, in step S1100, the first voltage setting operation may be performed on voltage intervals of the first output data signal. Here, the first output data signal may be generated based on the first input data and a result of the first voltage setting operation, and a first voltage interval and a second voltage interval may become different from each other as the first voltage setting operation is performed. Similarly, in step S1200, the first voltage setting operation may be performed an voltage intervals of the second output data signal. In this case, the second output data signal may be generated based on the second input data and a result of the firsts voltage setting operation, and a third voltage interval and a fourth voltage interval may become different from each other as the first voltage setting operation is performed. The first voltage setting operation may be performed as described with reference to FIGS. 6 through 9.

The first voltage interval and the third voltage interval represent a difference between the same two voltage levels (e.g., a difference between the first and second voltage levels), and the second voltage interval and the fourth voltage interval also represent a difference between the same two voltage levels (e.g., a difference between the second and third voltage levels). Steps S1100 and S1200 may be performed such that the first and third voltage intervals become different from each other and/or the second and fourth voltage become are different from each other.

In the method of generating the multi-level signal according to example embodiments of the inventive concept, a selective or adaptive level change scheme may be implemented. In the selective level change scheme, at least some of all voltage intervals of each output data signal may be changed by changing a specific voltage level among all possible voltage levels of each output data signal. For example, the specific voltage level and the specific voltage interval corresponding thereto may be set differently on the first and second output data signals provided from different pins or pads. Accordingly, the signal characteristic at the receiver may be efficiently improved or enhanced.

Figure 12A:
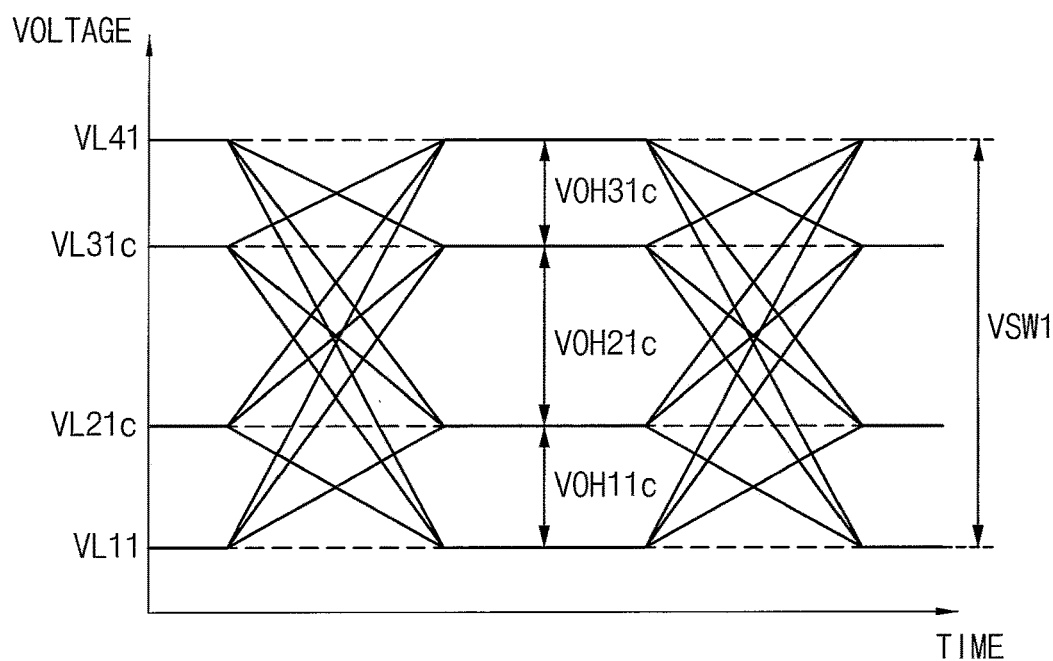
FIGS. 12A and 12B are diagrams for describing operations performed by a method of generating a multi-level signal and a transmitter according to example embodiments of the inventive concept.
Figure 12B:
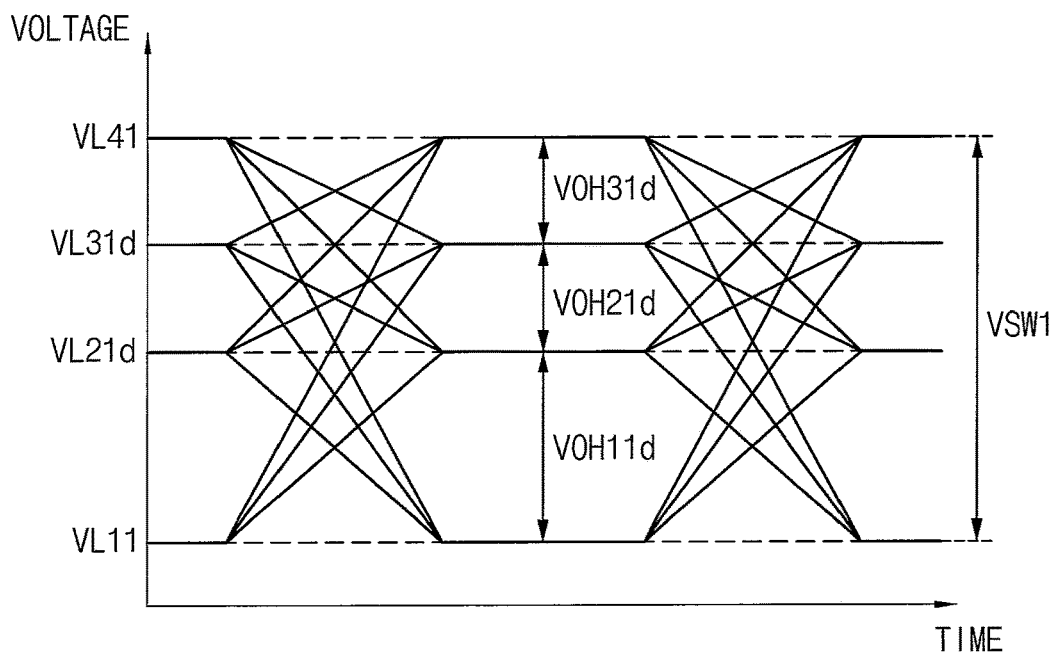

FIGS. 12A and 12B are diagrams for describing operations performed by a method of generating a multi-level signal and a transmitter according to example embodiments of the inventive concept.

Referring to FIG. 12A, as the voltage interval adjustment is performed on the first output data signal, voltage levels VL21c and VL31c may be adjusted, and voltage intervals VOH11c, VOH21c and VOH31c may be changer. As compared with the example of FIG. 6B, the first and fourth voltage levels VL11 and VL41 and the voltage swing width VSW1 may be maintained in an example of FIG. 12A, the second voltage interval VOH21c may increase in the example of FIG. 12A, and the first and third voltage intervals VOH11c and VOH31c may decrease in the example of FIG. 12A. In addition, in the example of FIG. 12A, the first, second and third voltage intervals VOH11c, VOH21c and VOH31c may be different from each other, and the first voltage interval VOH11c may be less than the second voltage interval VOH21c and may be larger than the third voltage interval VOH31c.

Referring to FIG. 12B, as the voltage interval adjustment is performed on the second output data signal, voltage levels VL21d and VL31d may be adjusted, and voltage intervals VOH11d, VOH21d and VOH31d may be changed. As compared with the example of FIG. 6B, the first and fourth voltage levels VL11 and VL41 and the voltage swing width VSW1 may be maintained in an example of FIG. 12B, the first voltage interval VOH11d may increase in the example of FIG. 12B, and the second and third voltage intervals VOH21d and VOH31d may decrease in the example of FIG. 12B. In addition, in the example of FIG. 12B, the first voltage interval VOH11d may be larger than the second and third voltage intervals VOH21d and VOH31d, and the second and third voltage intervals VOH21d and VOH31d may be equal to each other. The voltage levels VL21d and VL31d and the voltage intervals VOH11d, VOH21d and VOH31d may be different from the voltage levels VL21c and VL31c and the voltage intervals VOH11c, VOH21c and VOH31c in FIG. 12A, respectively.

Even if the transmitters generate and transmit the plurality of data signals such that all the voltage intervals VOH11, VOH21 and VOH31 for all the data signals are set to be equal to each other as illustrated in FIG. 6B, the voltage intervals for the data signals may be changed at the receivers, the eye characteristics may be changed for each pin or pad and the signal transmission characteristics may be deteriorated or degraded, due to the characteristics of the channels and the variations on the data signals. When the transmitters generate and transmit the plurality of data signals such that at least two of the voltage intervals are set to be different from each other to suit the characteristics of the channels and the voltage intervals are set to be different for each pin or pad to suit the characteristics of the channels according to example embodiments of the inventive concept, the signal characteristic at the receiver may be efficiently improved or enhanced.

In some example embodiments of the inventive concept, each of steps S1100 and S1200 in FIG. 10 may be implemented to perform steps S100, S200 and S300 in FIG. 1. In other words, both a first voltage setting operation for adjusting voltage intervals of the multi-level signal and a second voltage setting operation for adjusting a voltage swing width of the multi-level signal may be performed on each of the first and second output data signal. For example, the first and second output data signals may have the waveforms of FIGS. 9A and 9B, respectively.

Figure 13:
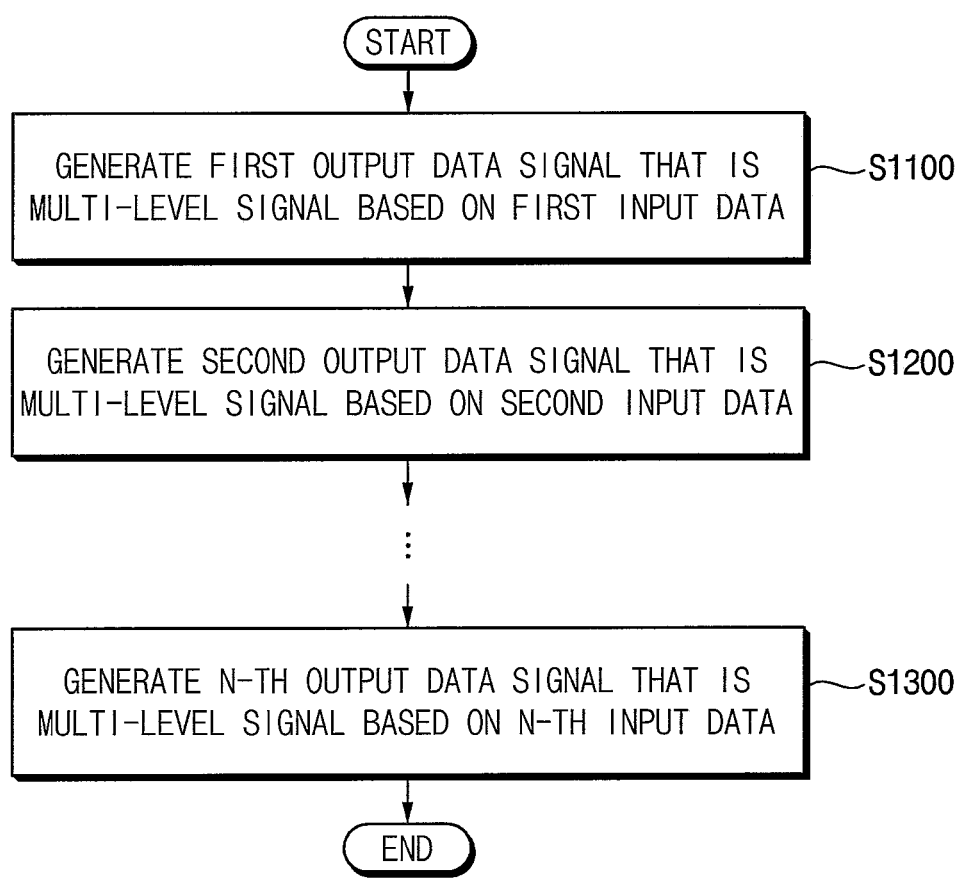
FIG. 13 is a flowchart illustrating a method of generating a multi-level signal according to example embodiments of the inventive concept.

FIG. 13 is a flowchart illustrating a method of generating a multi-level signal according to example embodiments of the inventive concept. The descriptions corresponding to those already made for FIG. 10 will be omitted.

Referring to FIG. 13, in a method of generating a multi-level signal according to example embodiments of the inventive concept, steps S1100 and S1200 may be substantially the same as steps S1100 and S1200 in FIG. 10, respectively. An N-th output data signal that is the multi-level signal is generated based on N-th input data including two or more bits and a result of at least one voltage setting operation (step S1300). Step S1300 may be similar to steps S1100 and S1200.

Figure 14:
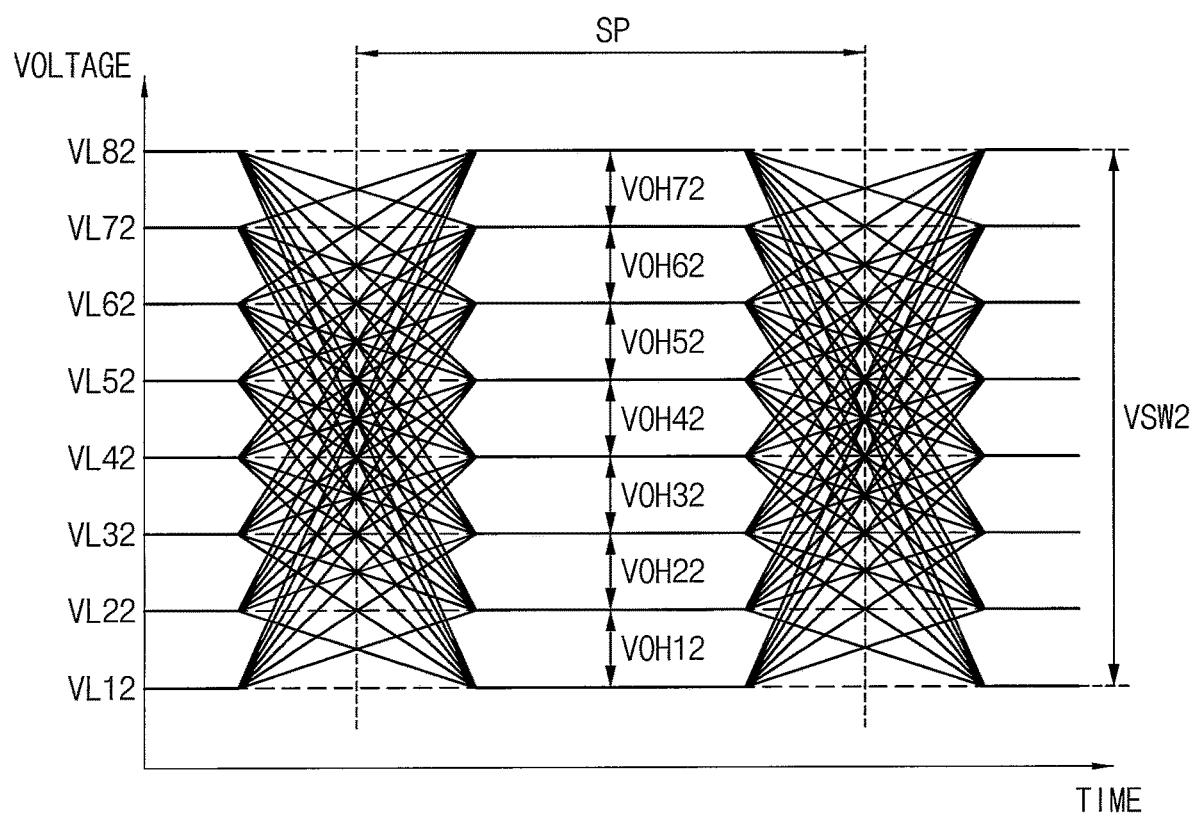
FIG. 14 is a diagram for describing a data signal generated by a method of generating a multi-level signal according to example embodiments of the inventive concept.

FIG. 14 is a diagram for describing a data signal generated by a method of generating a multi-level signal according to example embodiments of the inventive concept. The descriptions corresponding to those already made for FIG. 6B will be omitted.

Referring to FIG. 14, different first, second, third, fourth, fifth, sixth, seventh and eighth voltage levels VL12, VL22, VL32, VL42, VL52, VL62, VL72 and VL82 of a data signal (e.g., a PAM8 signal) that is generated based on the 8-level scheme (e.g., the PAM8 scheme) are illustrated, different first, second, third, fourth, fifth, sixth and seventh voltage intervals VOH12, VOH22, VOH32, VOH42, VOH52, VOH62 and VOH72 of the data signal are illustrated, and a voltage swing width VSW2 of the data signal is illustrated. As described above, the selective level change for adjusting the voltage intervals and/or the voltage swing width may be performed.

Figure 15:
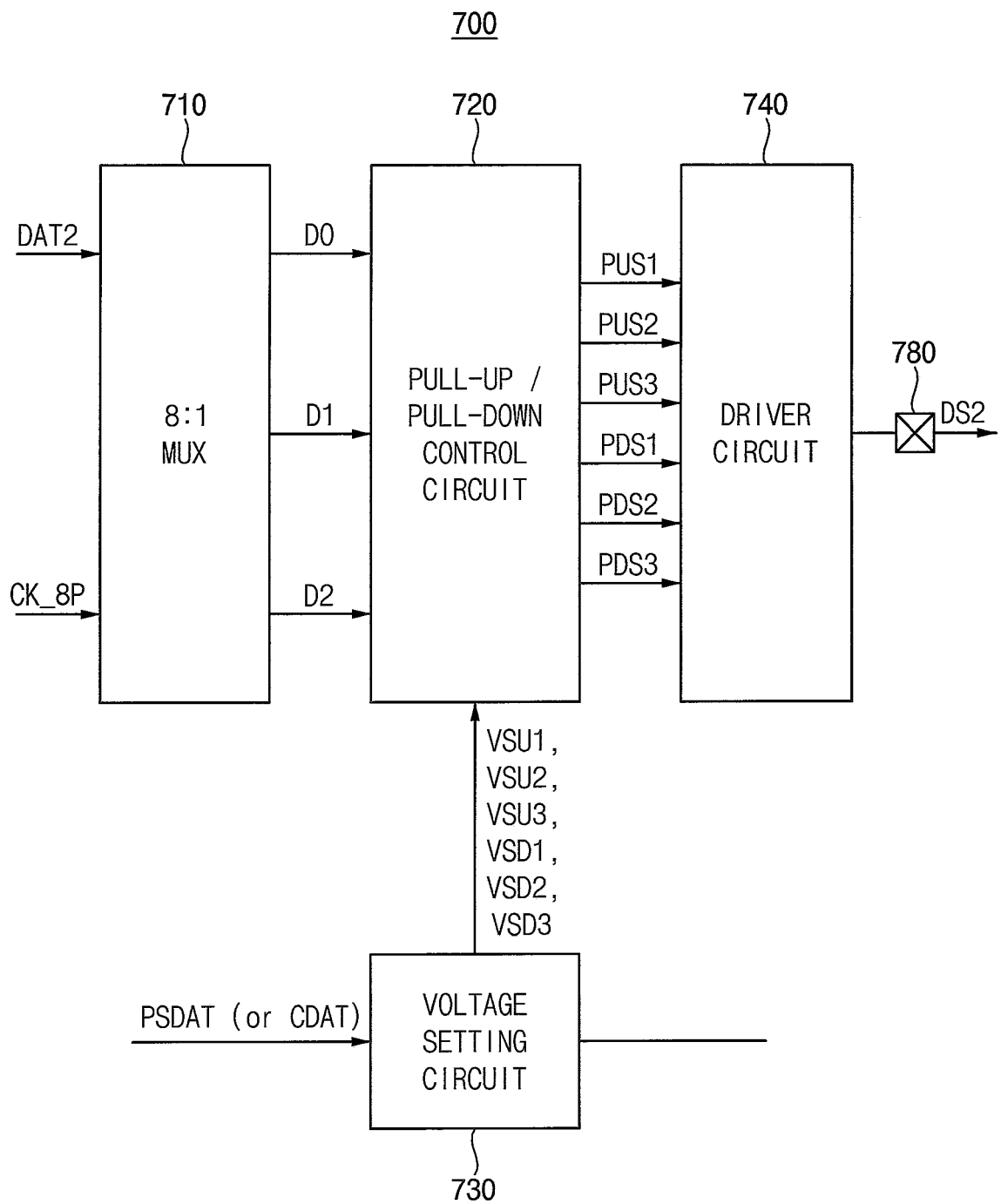
FIG. 15 is a block diagram illustrating a transmitter according to example embodiments of the inventive concept.

FIG. 15 is a block diagram illustrating a transmitter according to example embodiments of the inventive concept. The descriptions corresponding, to those already made for FIG. 7 will be omitted.

Referring to FIG. 15, a transmitter 700 includes a pull-up/pull-down control circuit 720, a voltage setting circuit 710 and a driver circuit 740. The transmitter 700 may further include a multiplexer 710 and a data I/O pad 780. The multiplexer 710, the pull-up/pull-down control circuit 720, the voltage setting circuit 730, the driver circuit 740 and the data I/O pad 780 may correspond to the multiplexer 510, the pull-up/pull-down control circuit 520, the voltage setting circuit 530, the driver circuit 540 and the data I/O pad 580 in FIG. 7, respectively.

In an example of FIG. 15, input data DAT2 may include a first bit D0, a second bit D1 and a third bit D2 that are different from each other, and the multiplexer 710 may divide the input data DAT2 into the first, second and third bits D0, D1 and D2 based on an eight-phase clock signal CK_8P. An output data signal DS2 may correspond to the data signal illustrated in FIG. 14, and may have one of the first, second, third, fourth, fifth, sixth, seventh and eighth voltage levels VL12, VL22, VL32, VL42, VL52, VL62, VL72 and VL82, that are different from each other, during one unit interval. The first and second voltage setting operations may be performed by adjusting at least one of the voltage levels VL12, VL22, VL32, VL42, VL52, VL62, VL72 and VL82.

In some example embodiments of the inventive concept, the first bit D0 may be a LSB of the input data DAT2, the second bit D1 may be a central significant bit (CSB) of the input data DAT2, and the third bit D2 may be an MSB of the input data DAT2. Control signals PUS1, PDS1, VSU1 and VSD1 associated with the first bit D0 may be control signals for the LSB, control signals PUS2, PDS2, VSU2 and VSD2 associated with the second bit D1 may be control signals for the CSB, and control signals PUS3, PDS3, VSU3 and VSD3 associated with the third bit D2 may be control signals for the MSB.

Figure 16:
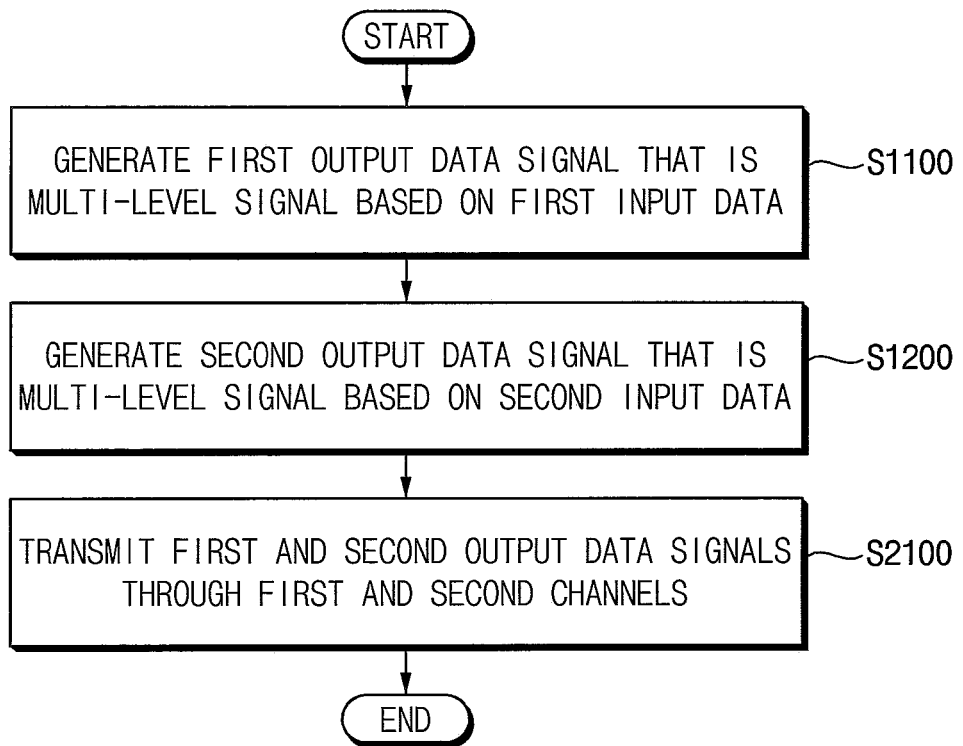
FIGS. 16 and 17 are flowcharts illustrating a method of transmitting data according to example embodiments of the inventive concept.
Figure 17:
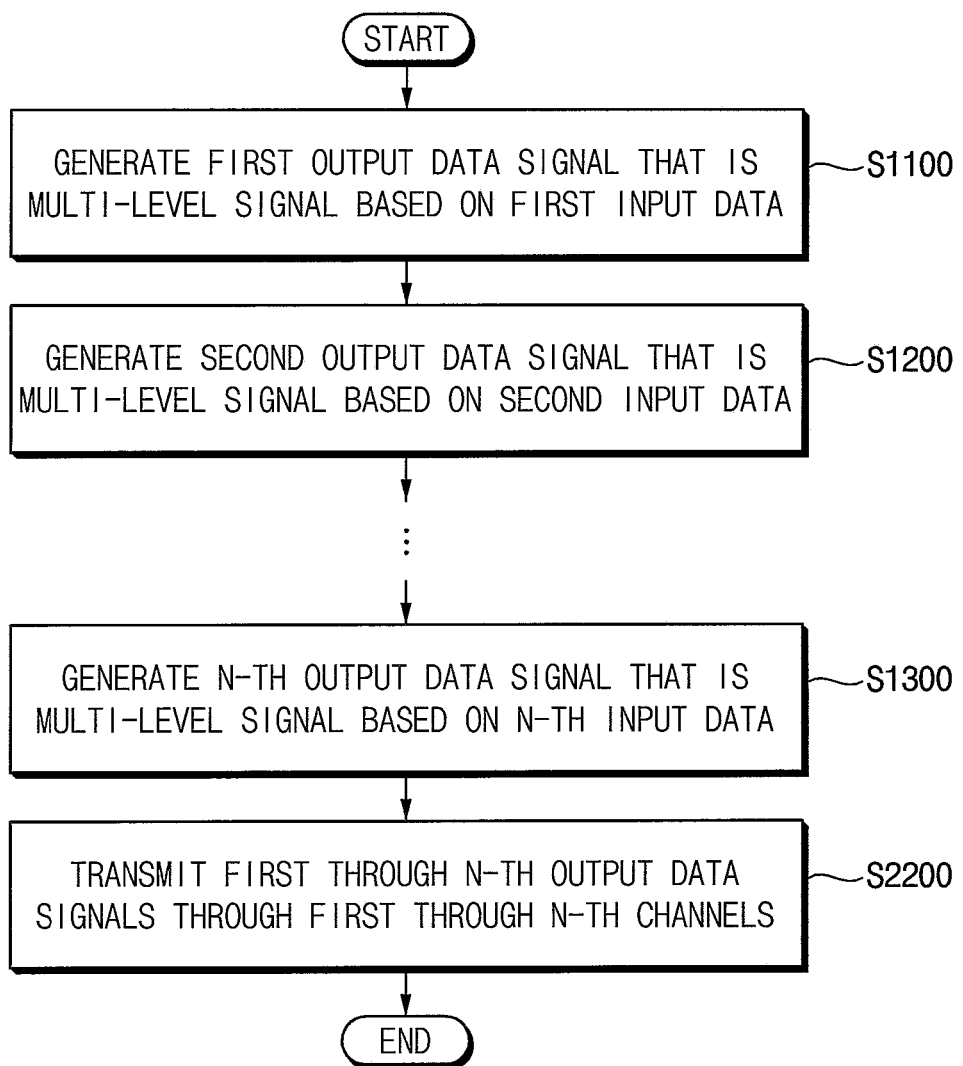

FIGS. 16 and 17 are flowcharts illustrating a method of transmitting data according to example embodiments of the inventive concept. The descriptions corresponding to those already made for FIGS. 10 and 13 will be omitted.

Referring to FIG. 16, in a method of transmitting data according to example embodiments of the inventive concept, steps S1100 and S1200 may be substantially the same as steps S1100 and S1200 in FIG. 10, respectively. The first output data signal and the second output data signal are transmitted through a first channel and a second channel that are different froth each other, respectively (Step S2100).

Referring, to FIG. 17, in a method of transmitting data according to example embodiments of the inventive concept, steps S1100, S1200 and S1300 may be substantially the same as steps S1100, S1200 and S1300 in FIG. 13, respectively. The first through N-th output data signals are transmitted through first through N-th channels that are different from each other, respectively (step S2200).

In some example embodiments of the inventive concept, characteristics of the first and second channels in FIG. 16 may be different from each other, and characteristics of the first through N-th channels in FIG. 17 may be different from each other. For example, the output data signals may have different waveforms (e.g., different waveforms in FIGS. 9A and 9B, or different waveforms in FIGS. 12A and 12B) in consideration of the characteristics of the channels (e.g., characteristics for each pin or pad).

In some example embodiments of the inventive concept, the methods of transmitting the data of FIGS. 16 and 17 may be performed by the memory system according to example embodiments of the inventive concept. For example, as described with reference to FIG. 3A, the output data signals may be generated by the memory controller 21 (e.g., by the transmitters 25a, 25b and 25c). As another example, as described with reference to FIG. 3B, the output data signals may be generated by the memory device 41 (e.g., by the transmitters 45a, 45b and 45c).

Figure 18A:
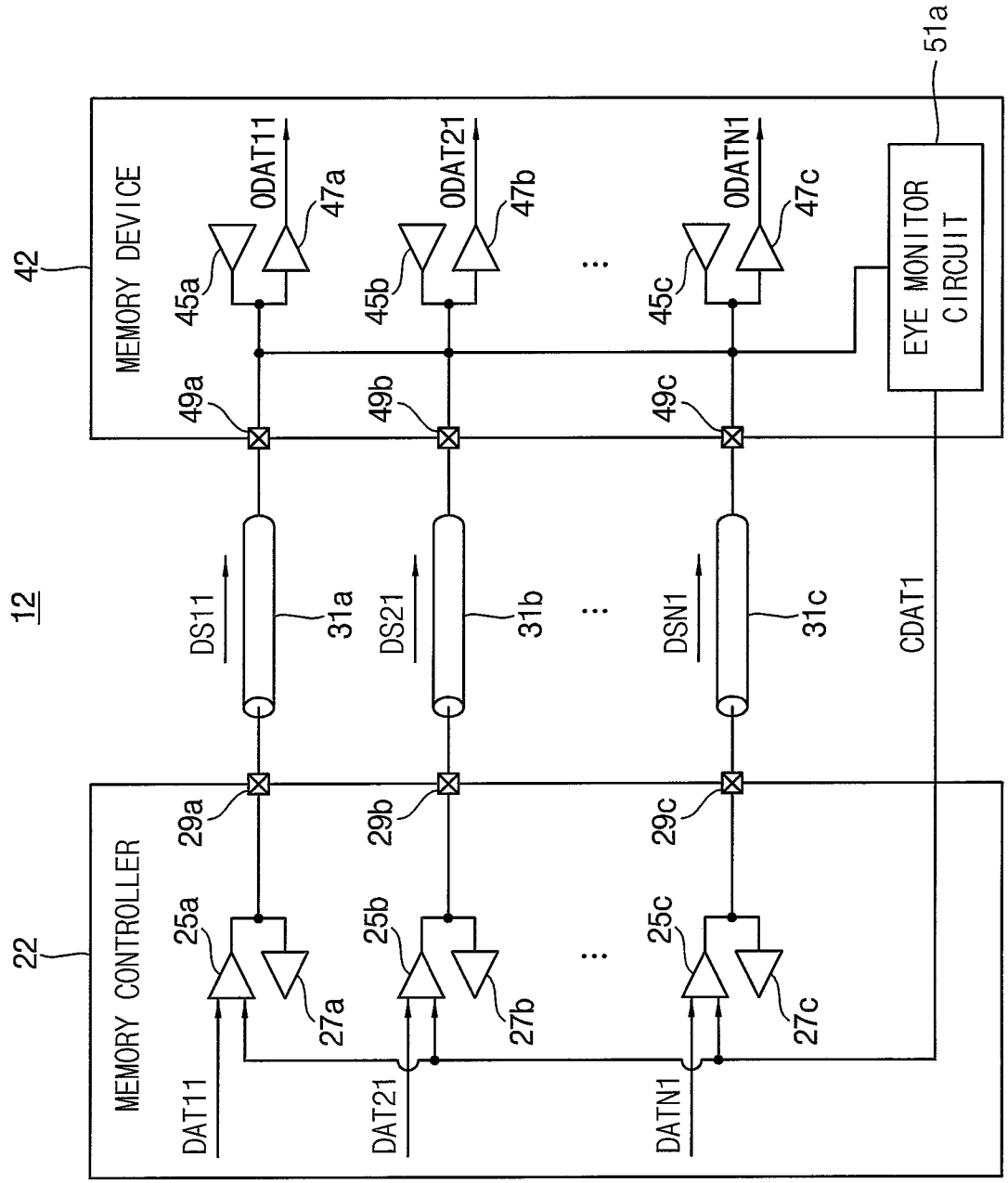
FIGS. 18A and 18B are block diagrams illustrating another example of a memory system of FIG. 2.
Figure 18B:
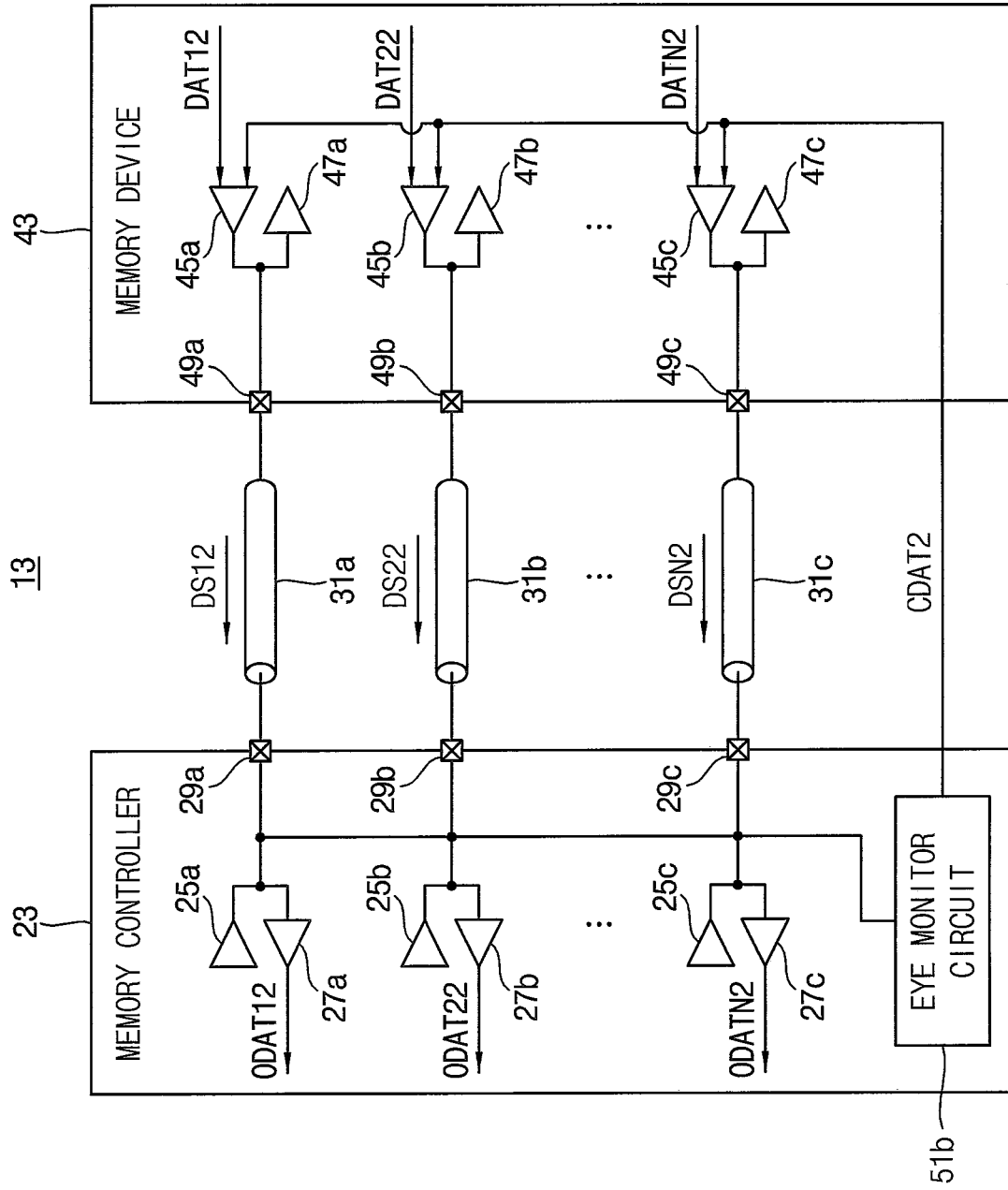

FIGS. 18A and 18B are block diagrams illustrating another example of a memory system of FIG. 2. The descriptions corresponding to those already made for FIGS. 3A and 3B will be omitted.

Referring to FIG. 18A, a memory system 12 includes a memory controller 22, a memory device 42 and a plurality of channels 31a, 31b and 31c.

The memory system 12 may be substantially the same as the memory system 11 of FIG. 3A except that the memory device 42 further includes an eye monitor circuit 51a.

The eye monitor circuit 51a may be connected to the plurality of channels 31a, 31b and 31c, and may generate characteristic data CDAT1 that represents characteristics of the channels 31a, 31b and 31c based on the received output data signals DS11, DS21 and DS31. A voltage setting circuit (e.g., the voltage setting circuit 530 in FIG. 7) included in each of the transmitters 25a, 25b and 25c may generate voltage setting control signals based on the characteristic data CDAT1. The first voltage setting operation and/oar the second voltage setting operation may be performed in real time based on the characteristics of the channels 31a, 31b and 31c. The characteristic data CDAT1 may be provided to inputs of the transmitters 25a, 25b and 25c.

Referring to FIG. 18B, a memory system 13 includes a memory controller 23, a memory device 43 and a plurality of channels 31a, 31b and 31c.

The memory system 13 may be substantially the same as the memory system 11 of FIG. 3B, except that the memory controller 23 further includes an eye monitor circuit 51b generating characteristic data CDAT2. The eye monitor circuit 51b may be substantially the same as the eye monitor circuit 51a in FIG. 18A. The characteristic data CDAT2 may be provided to inputs of the transmitters 45a, 45b and 45c.

In some example embodiments of the inventive concept, the eye monitor circuits 51a and 51b may be provided for each channel and/or may be disposed outside the memory controller (e.g., 22/23) and the memory device (e.g., 42/43).

The training operation in FIGS. 18A and 18B will be described in detail as follows. Before the training operation, all transmitters connected to each data I/O pad (or pin) may receive the same code for generating output signals to have the same voltage interval. After that, a command for starting the training operation may be received, and different random patterns may be output for each pin based on the command. After that, eyes may be checked for each pin, and different codes may be provided for each pin and each voltage level. As the training operation is performed, output signals may be generated to have different voltage intervals for each pin. For example, a ZQ code may be changed in a case of on-resistance (or on-die) training, or an additional change circuit may be used to change the codes or voltage intervals. When the training operation is completed for each pin and for each level, signals received by the receivers may have optimal voltage intervals for each pin and for each level. In some example embodiments of the inventive concept, the above-described training operation may be sequentially performed for each pin, or may be simultaneously (e.g., globally) performed for all pins.

Figure 19:
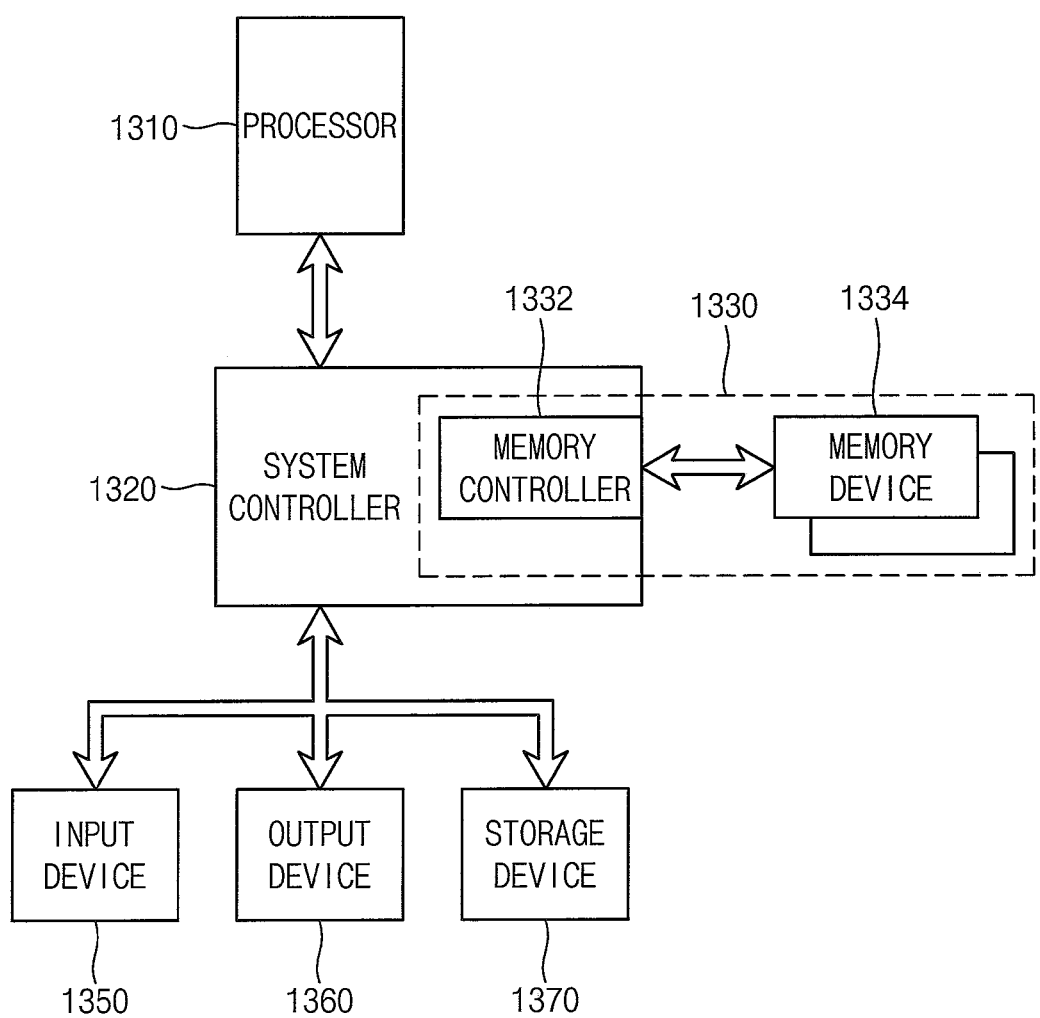
FIG. 19 is a block diagram illustrating a computing system according to example embodiments of the inventive concept.

FIG. 19 is a block diagram illustrating a computing system according to example embodiments of the inventive concept.

Referring to FIG. 19, a computing system 1300 includes a processor 1310, a system controller 1320 and a memory system 1330. The computing system 1300 may further include an input device 1350, an output device 1360 and a storage device 1370.

The memory system 1330 includes a plurality of memory devices 1334, and a memory controller 1332 for controlling the memory devices 1334. The memory controller 1332 may be included in the system controller 1320. The memory system 1330 may be the memory system according to example embodiments of the inventive concept, and may perform the method of generating the multi-level signal and the method of transmitting the data according to example embodiments of the inventive concept.

The processor 1310 may perform carious computing functions, such as executing specific software instructions for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320.

Figure 20:
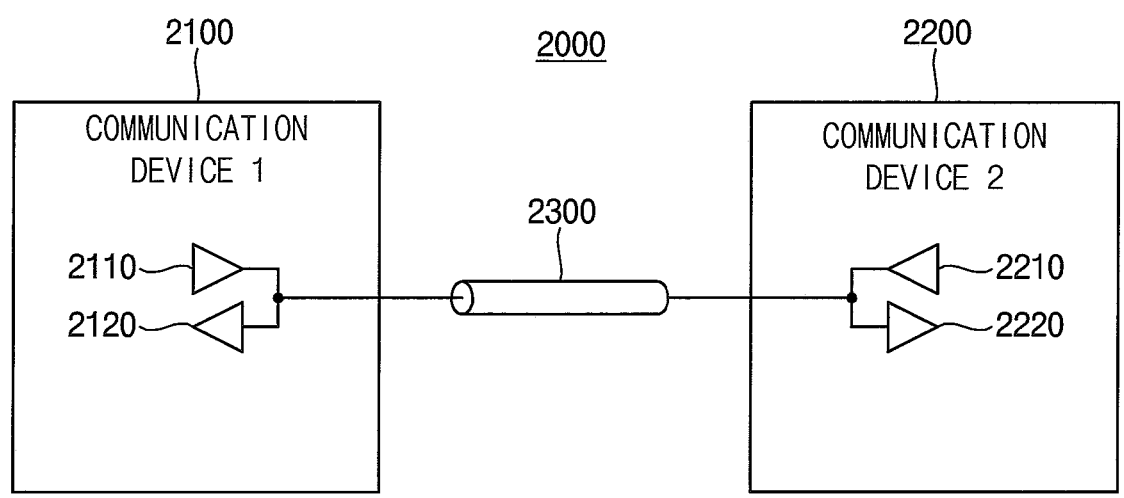
FIG. 20 is a block diagram illustrating a communication system according to example embodiments of the inventive concept.

FIG. 20 is a block diagram illustrating a communication system according to example embodiments of the inventive concept.

Referring to FIG. 20, a communication system 2000 includes a first communication device 2100, a second communication device 2200 and a channel 2300.

The first communication device 2100 includes a first transmitter 2110 and a first receiver 2120. The second communication device 2200 includes a second transmitter 2210 and a second receiver 2220. The first transmitter 2110 and the first receiver 2120 are connected to the second transmitter 2210 and the second receiver 2220 through the channel 2300. In some example embodiments of the inventive concept, each of the first and second communication devices 2100 and 2200 may include a plurality of transmitters and a plurality of receivers, and the communication system 2000 may include a plurality of channels for connecting the plurality of transmitters and a plurality of receivers.

The transmitters 2110 and 2210 may be the transmitter according to example embodiments of the inventive concept, and may perform the method of generating the multi-level signal and the method of transmitting the data according to example embodiments of the inventive concept.

The inventive concept may be applied to various devices and systems that include the memory devices and the memory systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

In the method of generating the multi-level signal, the method of transmitting the data, and the transmitter and the memory system according to example embodiments of the inventive concept, the selective or adaptive level change scheme may be implemented. In the selective level change scheme, at least some of all voltage intervals of the output data signal may be changed by changing a specific voltage level among all possible voltage levels of the output data signal. In addition, the voltage swing width may also be changed on one output data signal, or the specific voltage level and the specific voltage interval corresponding thereto may be set differently on the different output data signals provided horn different pins or pads. Accordingly, a signal characteristic at the receiver may be efficiently improved or enhanced.

What is claimed is:

1. A method of generating a multi-level signal having one of three or more voltage levels that are different from each other, the method comprising:
performing a first voltage setting operation in which a first voltage interval and a second voltage interval are adjusted to be different from each other, wherein the first voltage interval represents a difference between a first pair of adjacent voltage levels among the three or more voltage levels and the second voltage interval represents a difference between a second pair of adjacent voltage levels among the three or more voltage levels;
performing a second voltage setting operation in which a voltage swing width is adjusted, the voltage swing width representing a difference between a lowest voltage level and a highest voltage level among the three or more voltage levels; and
generating an output data signal that is the multi-level signal based on input data including two or more bits, a result of the first voltage setting operation and a result of the second voltage setting operation, wherein:
the first voltage setting operation and the second voltage setting operation are performed in real time based on characteristic data, and
the characteristic data represents a characteristic of a channel transmitting the output data signal, the characteristic data being provided from an eye monitor circuit, and
wherein:
in an initial operation time, a plurality of transmitters respectively connected to a plurality of data input/output (I/O) pads are provided with the same code to generate output data signals having the same voltage interval, and
in a training operation, different random patterns are provided for each of the plurality of data I/O pads, eyes are checked for each of the plurality of data I/O pads, different codes and voltage levels are provided for each of the plurality of data I/O pads, and output data signals are generated to have different voltage intervals optimized for each of the plurality of data I/O pads.

2. The method of claim 1, wherein:
the two or more bits include a first bit and a second bit that are different from each other,
the three or more voltage levels include a first voltage level, a second voltage level, a third voltage level and a fourth voltage level that are different from each other, and
the first voltage interval represents a difference between the first and second voltage levels, the second voltage interval represents a difference between the second and third voltage levels, and the voltage swing width represents a difference between the first and fourth voltage levels.

3. The method of claim 2, wherein:
when the first voltage setting operation is performed, a third voltage interval representing a difference between the third and fourth voltage levels is additionally set, and
the third voltage interval is different from the first and second voltage intervals.

4. The method of claim 2, wherein:
when the first voltage setting operation is performed, a third voltage interval representing a difference between the third and fourth voltage levels is additionally set, and
the third voltage interval is equal to one of the first and second voltage intervals.

5. The method of claim 2, wherein the first voltage setting operation and the second voltage setting operation are performed by adjusting at least one of the first, second, third and fourth voltage levels.

6. The method of claim 5, wherein the first voltage setting operation and the second voltage setting operation are simultaneously performed.

7. The method of claim 2, wherein the first bit is a least significant bit (LSB) of the input data, and the second bit is a most significant bit (MSB) of the input data.

8. The method of claim 2, wherein the second voltage level is higher than the first voltage level, the third voltage level is higher than the second voltage level, and the fourth voltage level is higher than the third voltage level.

9. The method of claim 1, wherein:
the two or more bits include a first bit, a second bit and a third bit that are different from each other,
the three or more voltage levels include a first voltage level, a second voltage level, a third voltage level, a fourth voltage level, a fifth voltage level, a sixth voltage level, a seventh voltage level and an eighth voltage level that are different from each other, and
the first voltage interval represents a difference between the first and second voltage levels, the second voltage interval represents a difference between the second and third voltage levels, and the voltage swing width represents a difference between the first and eighth voltage levels.

10. The method of claim 1, wherein:
in the initial operation time, the first voltage interval and the second voltage interval are set to be equal to each other, and the voltage swing width is set to have a first value, and
when the training operation is performed based on the characteristic data, the first voltage interval and the second voltage interval are set to be different from each other, and the voltage swing width is set to have a second value different from the first value.

11. A method of generating a multi-level signal having one of three or more voltage levels that are different from each other, the method comprising:
performing a first voltage setting operation in which a first voltage interval and a second voltage interval are adjusted to be different from each other, wherein the first voltage interval represents a difference between a first pair adjacent voltage levels among the three or more voltage levels and the second voltage interval represents a difference between a second pair of adjacent voltage levels among the three or more voltage levels;
performing a second voltage setting operation in which a third voltage interval and a fourth voltage interval are adjusted to be different from each other, wherein the third voltage interval represents a difference between a third pair of adjacent voltage levels among the three or more voltage levels and the fourth voltage interval represents a difference between a fourth pair of adjacent voltage levels among the three or more voltage levels, the third voltage interval being different from the first voltage interval or the fourth voltage interval being different from the second voltage interval;
generating a first output data signal that is the multi-level signal based on first input data including two or more bits and a result of the first voltage setting operation; and
generating a second output data signal that is the multi-level signal based on second input data including two or more bits and a result of the second voltage setting operation, wherein:
the first output data signal is transmitted through a first channel, and
the second output data signal is transmitted through a second channel different from the first channel,
wherein:
the first voltage setting operation and the second voltage setting operation are performed in real time based on characteristic data, and
the characteristic data represents characteristics of the first and second channels, the characteristic data being provided from an eye monitor circuit, and
wherein:
in an initial operation time, a plurality of transmitters respectively connected to a plurality of data input/output (I/O) pads are provided with the same code to generate output data signals having the same voltage interval, and
in a training operation, different random patterns are provided for each of the plurality of data I/O pads, eyes are checked for each of the plurality of data I/O pads, different codes and voltage levels are provided for each of the plurality of data I/O pads, and output data signals are generated to have different voltage intervals optimized for each of the plurality of data I/O pads.

12. The method of claim 11, wherein:
in the initial operation time, the first voltage interval, the second voltage interval, the third voltage interval and the fourth voltage interval are set to be equal to each other, and
when the training operation is performed based on the characteristic data, the first voltage interval and the second voltage interval are set to be different from each other, the third voltage interval and the fourth voltage interval are set to be different from each other, and the third voltage interval is set to be different from the first voltage interval or the fourth voltage interval is set to be different from the second voltage interval.

13. The method of claim 11, wherein:
the two or more bits include a first bit and a second bit that are different from each other,
the three or more voltage levels include a first voltage level, a second voltage level, a third voltage level and a fourth voltage level that are different from each other,
the first voltage interval represents a difference between the first and second voltage levels, and the second voltage interval represents a difference between the second and third voltage levels, and
the third voltage interval represents a difference between the first and second voltage levels, and the fourth voltage interval represents a difference between the second and third voltage levels.

14. The method of claim 13, wherein:
when the first voltage setting operation is performed, at least one of the first, second, third and fourth voltage levels for generating the first output data signal is adjusted, and when the second voltage setting operation is performed, at least one of the first, second, third and fourth voltage levels for generating the second output data signal is adjusted.

15. A method of transmitting data based on a multi-level signal having one of a first voltage level, a second voltage level, a third voltage level and a fourth voltage level that are different from each other, the method comprising:
performing a first voltage setting operation on a first channel such that at least two of a first voltage interval, a second voltage interval and a third voltage interval are different from each other, the first voltage interval representing a difference between the first and second voltage levels on the first channel, the second voltage interval representing a difference between the second and third voltage levels on the first channel, the third voltage interval representing a difference between the third and fourth voltage levels on the first channel;
performing a second voltage setting operation on the first channel such that a first voltage swing width, which represents a difference between the first and fourth voltage levels on the first channel, is changed;
performing a third voltage setting operation on a second channel such that at least two of a fourth voltage interval, a fifth voltage interval and a sixth voltage interval are different from each other, the second channel being different from the first channel, the fourth voltage interval representing a difference between the first and second voltage levels on the second channel, the fifth voltage interval representing a difference between the second and third voltage levels on the second channel, the sixth voltage interval representing a difference between the third and fourth voltage levels on the second channel;
performing a fourth voltage setting operation on the second channel such that a second voltage swing width, which represents a difference between the first and fourth voltage levels on the second channel, is changed;
generating a first output data signal that is the multi-level signal based on first input data including a first bit and a second bit that are different from each other, a result of the first voltage setting operation and a result of the second voltage setting operation;
generating a second output data signal that is the multi-level signal based on second input data including a third bit and a fourth bit that are different from each other, a result of the third voltage setting operation and a result of the fourth voltage setting operation; and
transmitting the first and second output data signals through the first and second channels, respectively,
wherein:
the first voltage setting operation and the second voltage setting operation are performed in real time based on characteristic data, and
the characteristic data represents a characteristic of a channel transmitting the output data signal, the characteristic data being provided from an eye monitor circuit, and
wherein:
in an initial operation time, a plurality of transmitters respectively connected to a plurality of data input/output (I/O) pads are provided with the same code to generate output data signals having the same voltage interval, and
in a training operation, different random patterns are provided for each of the plurality of data I/O pads, eyes are checked for each of the plurality of data I/O pads, different codes and voltage levels are provided for each of the plurality of data I/O pads, and output data signals are generated to have different voltage intervals optimized for each of the plurality of data I/O pads.

* * * * *